(12) United States Patent
Tobita

(10) Patent No.: US 7,627,076 B2
(45) Date of Patent: Dec. 1, 2009

(54) SHIFT REGISTER CIRCUIT AND IMAGE DISPLAY APPARATUS HAVING THE SAME

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 45 days.

(21) Appl. No.: 11/676,866

(22) Filed: Feb. 20, 2007

(65) Prior Publication Data

US 2007/0195920 A1   Aug. 23, 2007

(30) Foreign Application Priority Data

Feb. 23, 2006 (JP) .............................. 2006-046250
Nov. 10, 2006 (JP) .............................. 2006-304985

(51) Int. Cl.
*G11C 19/00* (2006.01)
(52) U.S. Cl. .......................................... 377/64; 377/68
(58) Field of Classification Search .................. 377/64, 377/68–70, 74–77, 79
See application file for complete search history.

(56) References Cited

U.S. PATENT DOCUMENTS

| | | | | |
|---|---|---|---|---|
| 5,517,542 A * | 5/1996 | Huq | ............................... | 377/78 |
| 5,859,630 A * | 1/1999 | Huq | ............................ | 345/100 |
| 5,949,398 A * | 9/1999 | Kim | ........................... | 345/100 |
| 6,928,135 B2 * | 8/2005 | Sasaki et al. | .................. | 377/64 |
| 7,397,885 B2 * | 7/2008 | Moon et al. | .................... | 377/64 |

| | | | | |
|---|---|---|---|---|
| 2002/0150199 A1 * | 10/2002 | Sasaki et al. | ................... | 377/64 |
| 2007/0195920 A1 | 8/2007 | Tobita | | |
| 2008/0062071 A1 * | 3/2008 | Jeong | ........................... | 345/46 |

FOREIGN PATENT DOCUMENTS

| | | |
|---|---|---|
| CN | 1567688 A | 1/2005 |
| JP | 2004-78172 | 3/2004 |
| WO | WO 2006/100636 A2 | 9/2006 |
| WO | WO 2007/013010 A2 | 2/2007 |

OTHER PUBLICATIONS

U.S. Appl. No. 11/937,791, filed Nov. 9, 2007, Tobita.
U.S. Appl. No. 11/614,384, filed Dec. 21, 2006, Tobita.
U.S. Appl. No. 11/625,117, filed Jan. 19, 2007, Tobita.
U.S. Appl. No. 11/670,133, filed Feb. 1, 2007, Tobita, et al.
U.S. Appl. No. 11/676,866, filed Feb. 20, 2007, Tobita.
U.S. Appl. No. 11/838,416, filed Aug. 14, 2007, Tobita, et al.
U.S. Appl. No. 11/831,131, filed Jul. 31, 2007, Tobita.

* cited by examiner

*Primary Examiner*—Tuan Lam
(74) *Attorney, Agent, or Firm*—Oblon, Spivak, McClelland, Maier & Neustadt, L.L.P.

(57) ABSTRACT

In a shift register circuit, a reduction of a driving capability caused by an increased operating rate is prevented. A shift register circuit includes a first transistor between an output terminal and a clock terminal, a second transistor between the output terminal and a first power-supply terminal, and a third transistor between the gate of the first transistor and a second power-supply terminal. The shift register circuit further includes a fourth transistor that charges the gate node of the third transistor on the basis of a signal inputted to a first input terminal, and a capacitive element that boosts the gate node of the third transistor that has been charged.

23 Claims, 25 Drawing Sheets

F I G . 2
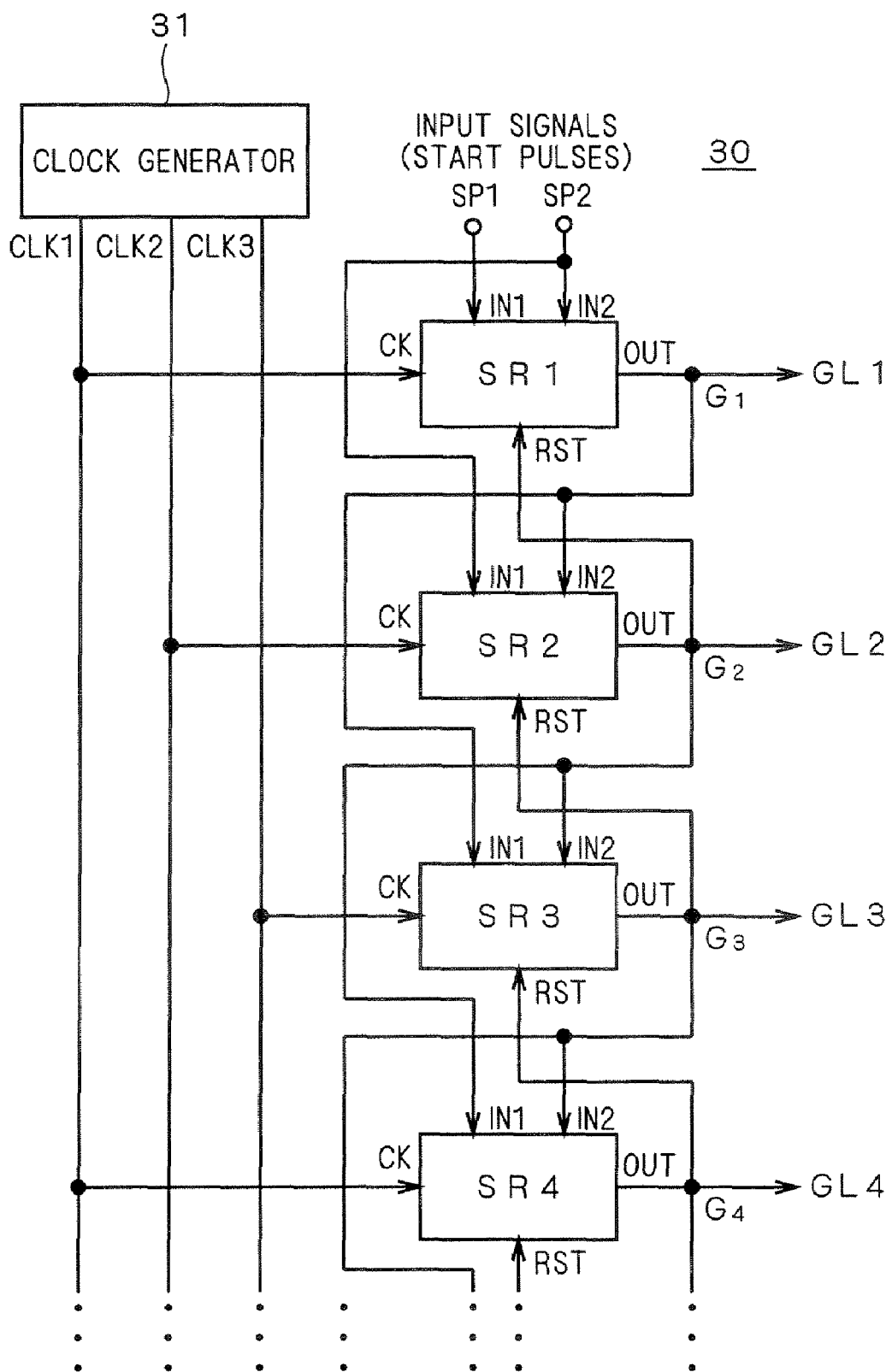

F I G. 3
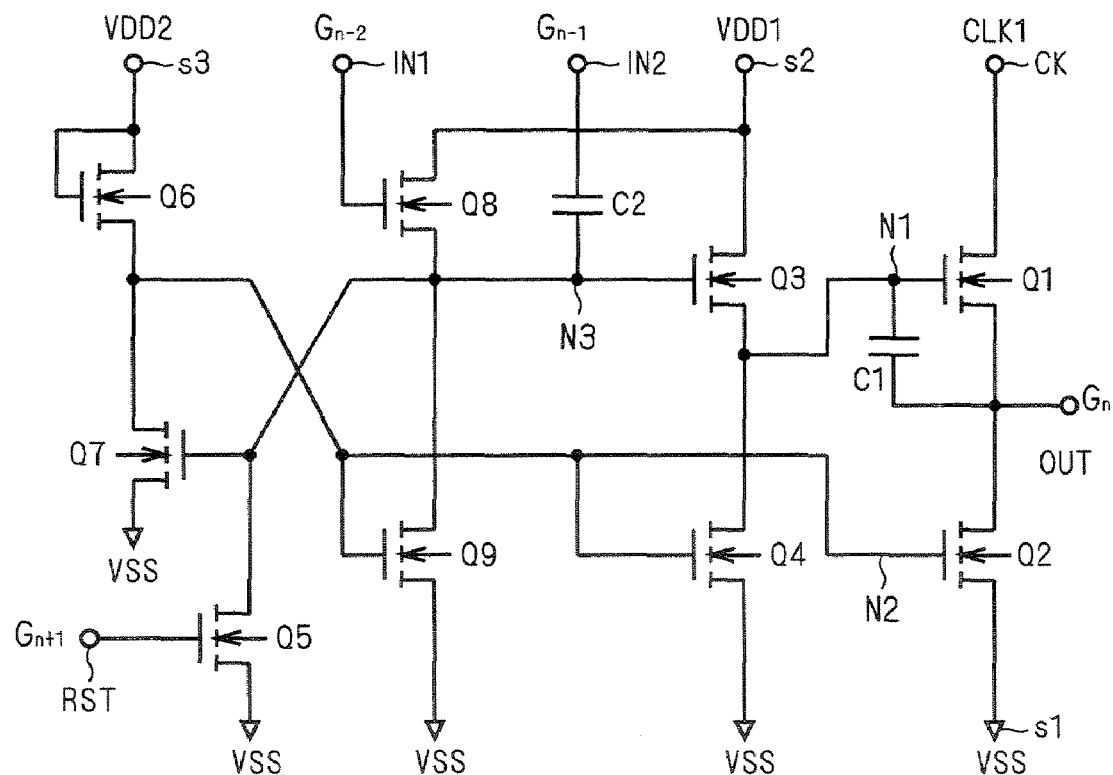

F I G. 7
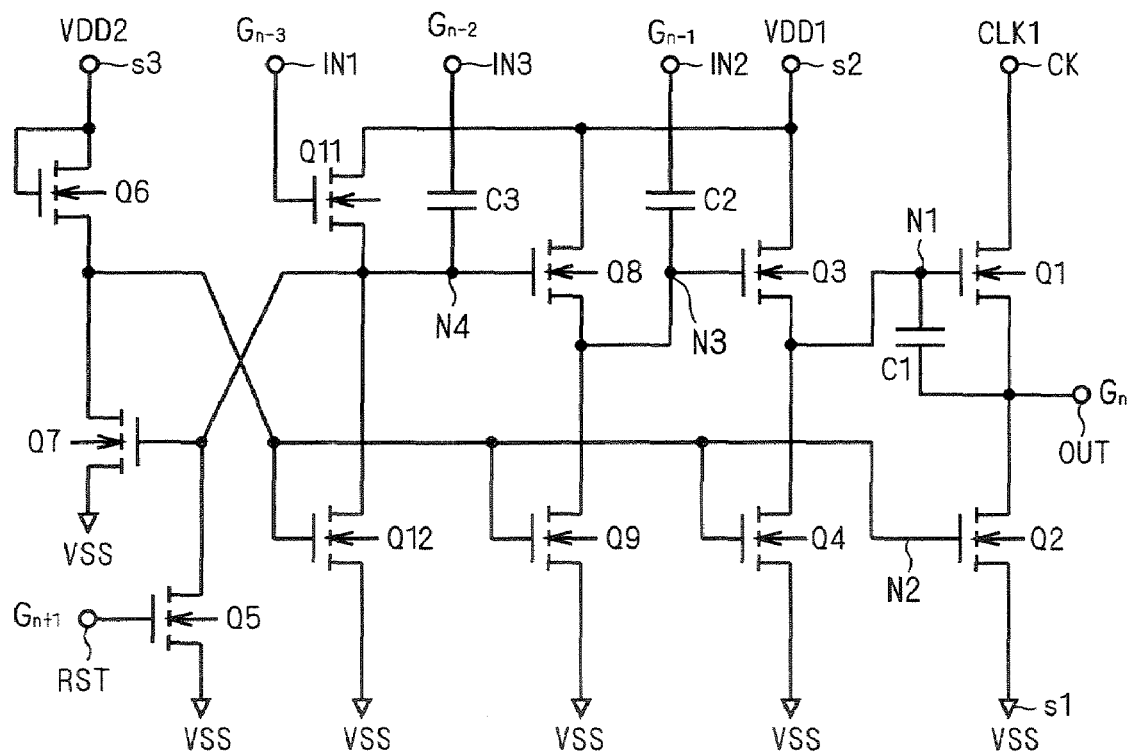

F I G . 1 1
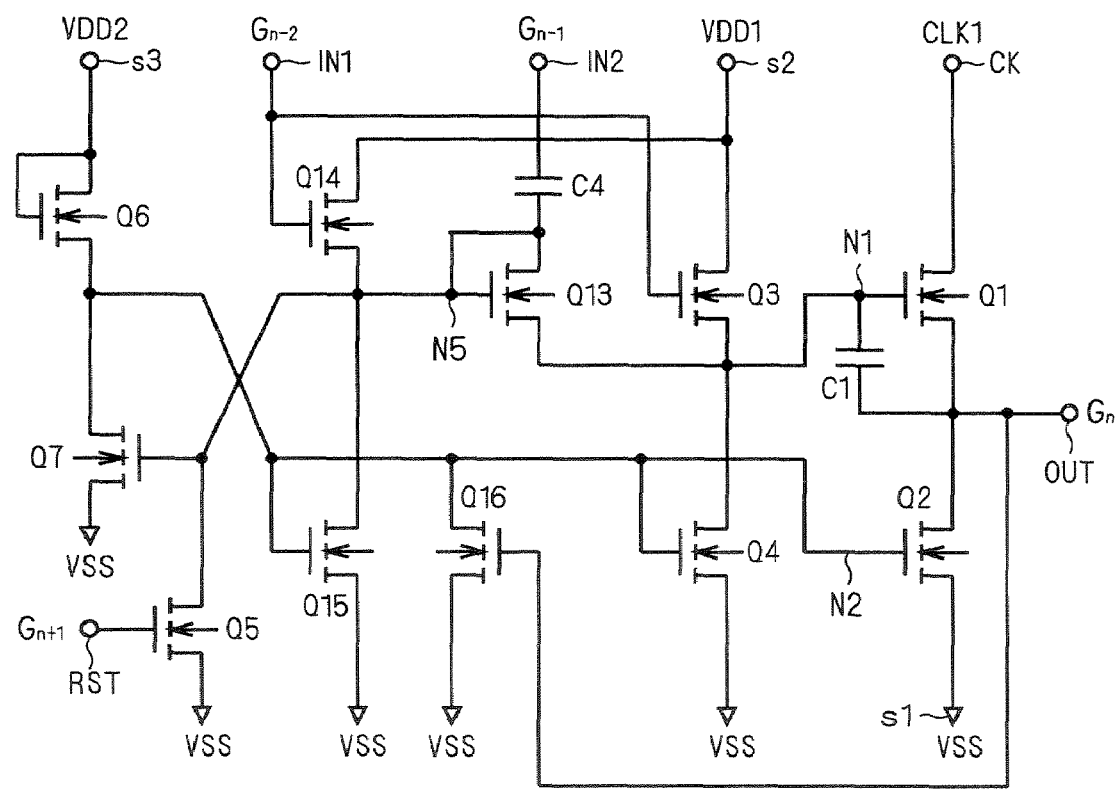

F I G . 1 4
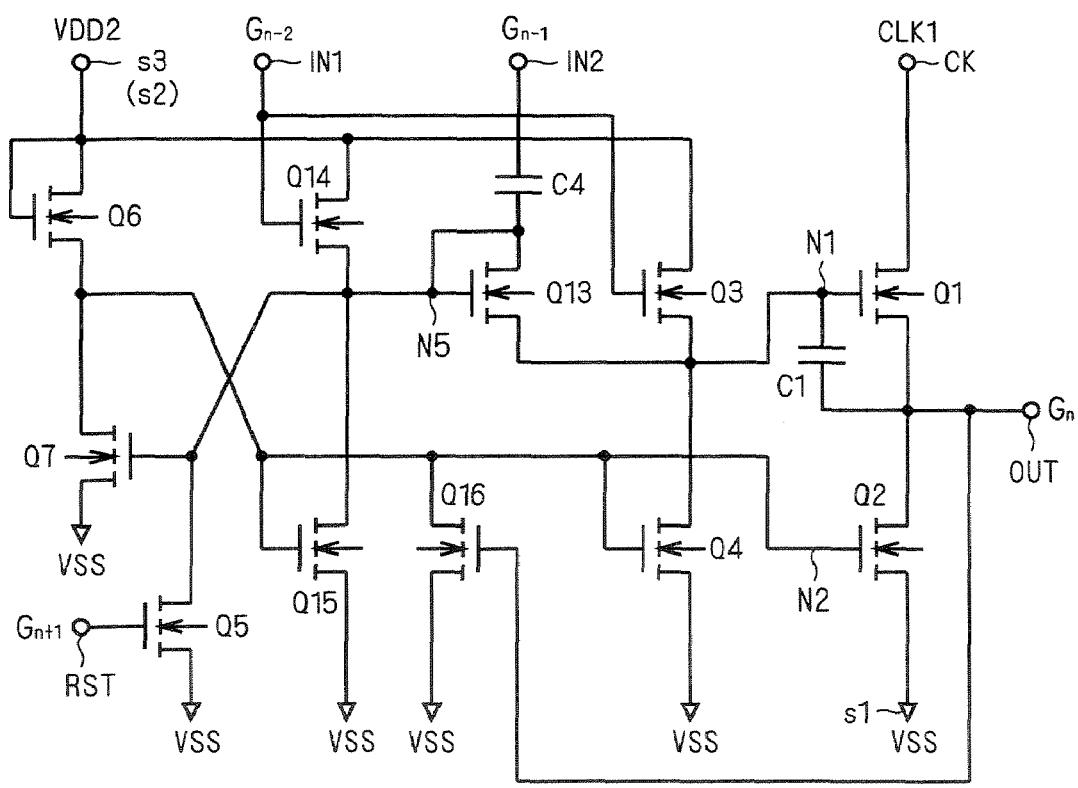

F I G . 1 5
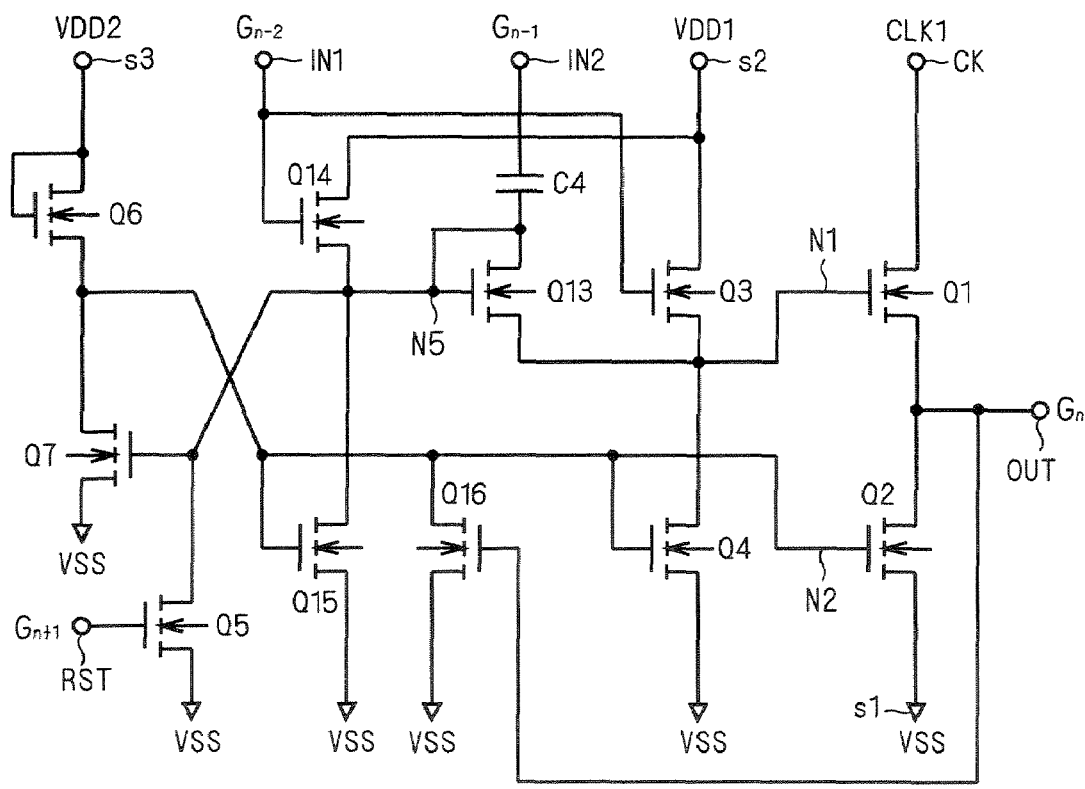

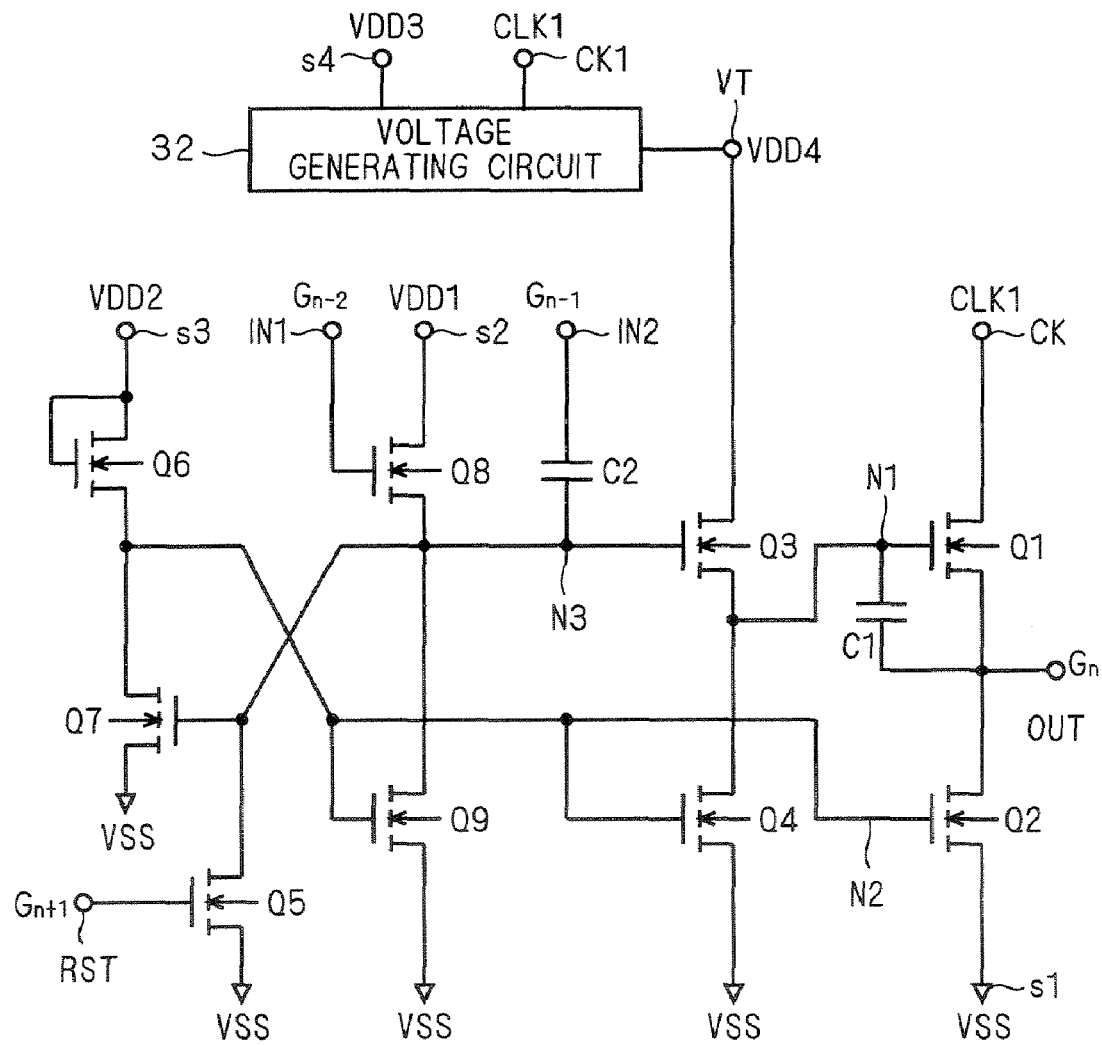
F I G. 1 6

F I G . 1 7
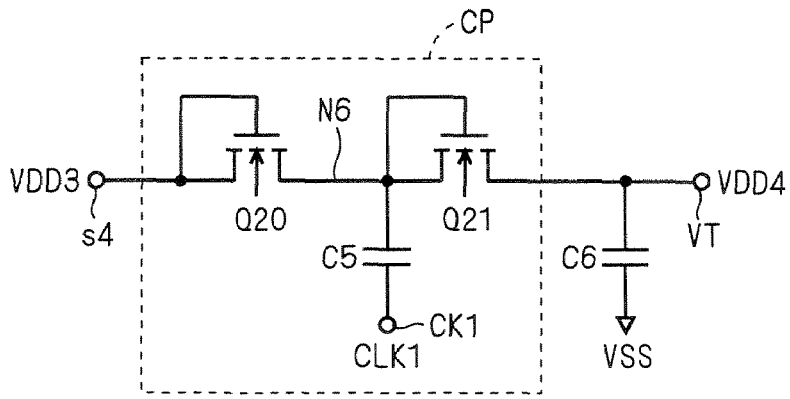
F I G . 1 8
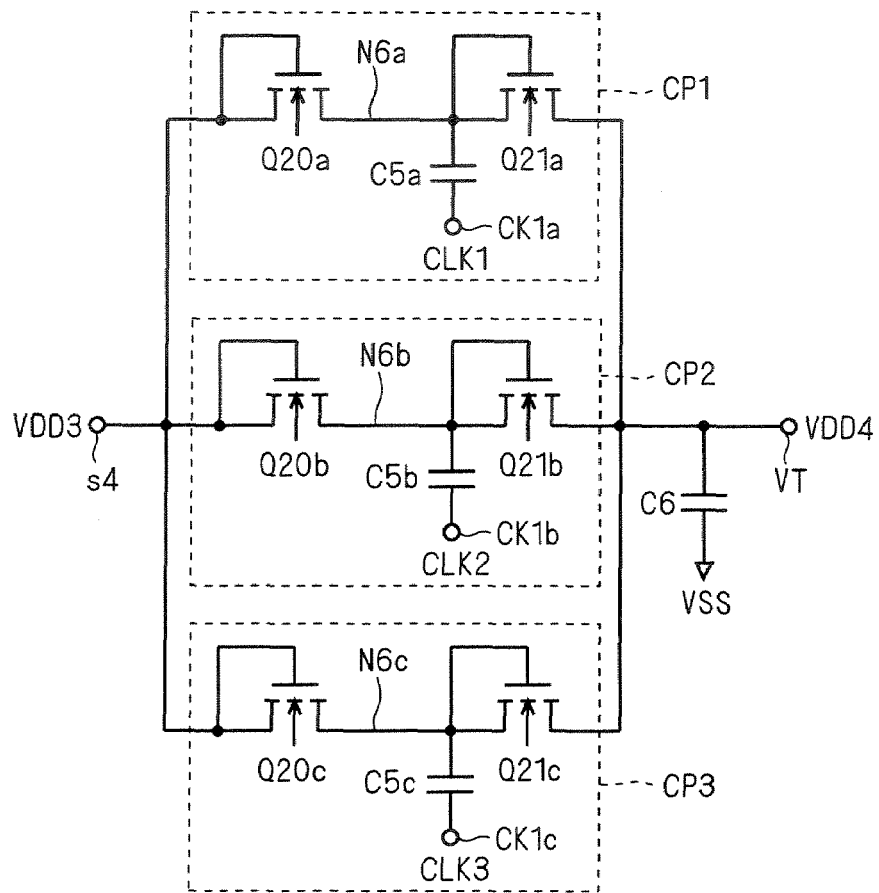

F I G . 2 4
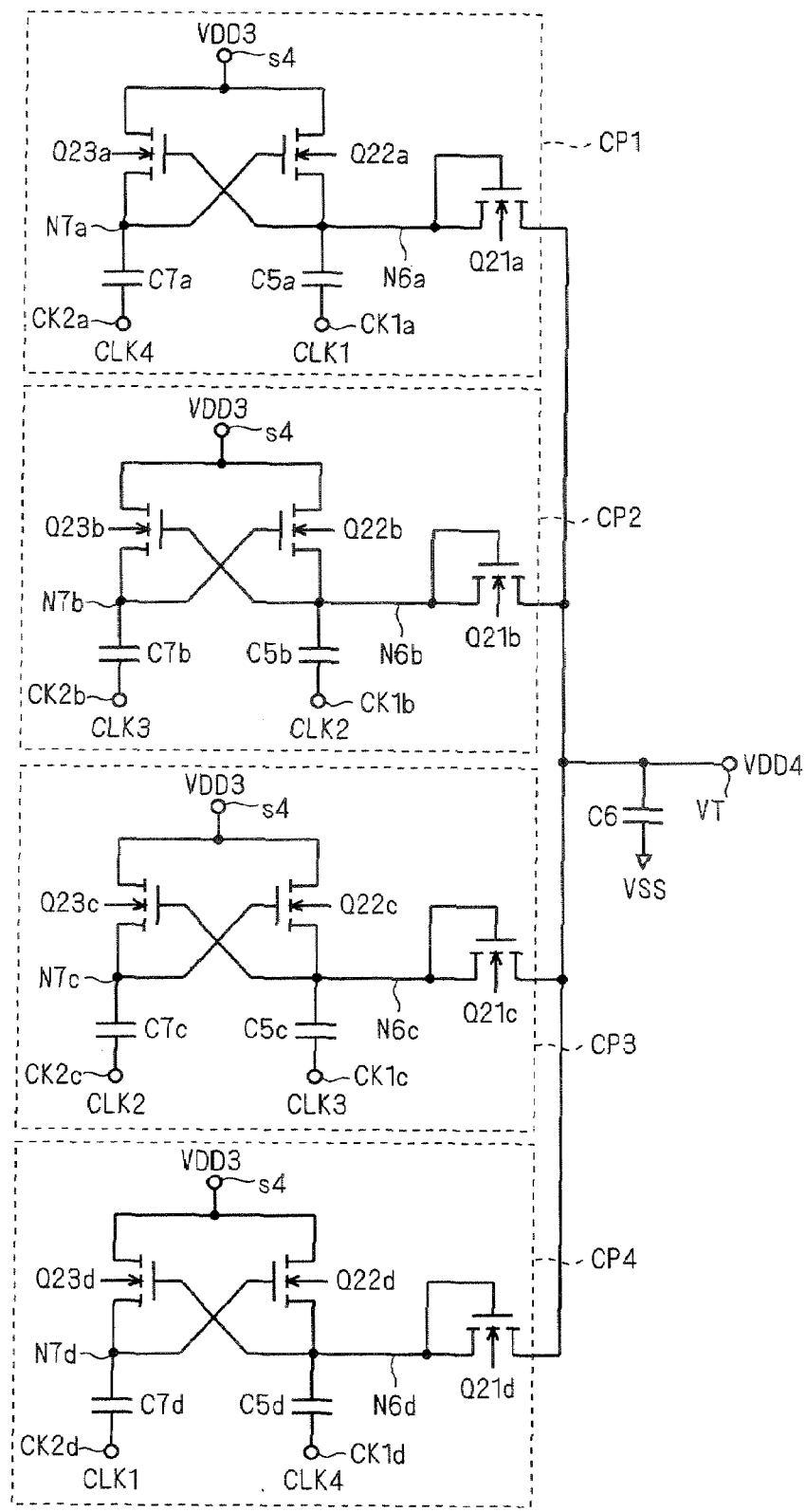

F I G . 2 6
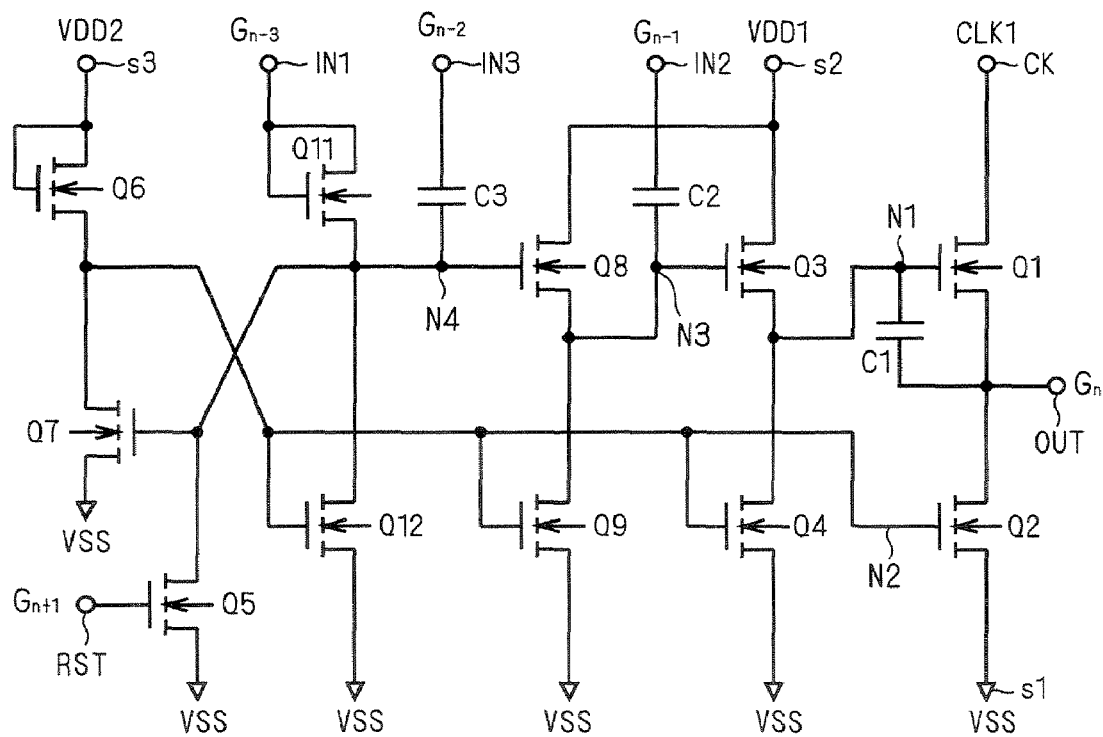

SHIFT REGISTER CIRCUIT AND IMAGE DISPLAY APPARATUS HAVING THE SAME

BACKGROUND OF THE INVENTION

1. Field of the Invention

The present invention relates to a shift register circuit, and particularly to a shift register circuit that is formed of field-effect transistors of only the same conductivity type, for use in, e.g., a scanning line driving circuit of an image display apparatus.

2. Description of the Background Art

An image display apparatus (hereinafter "display apparatus"), such as a liquid-crystal display apparatus, has a display panel where a plurality of pixels are arranged in a matrix, and gate lines (scanning lines) are provided for individual rows of the pixels (pixel lines). The gate lines are sequentially selected and driven in cycles based on one horizontal period of the display signal, so as to update the displayed image. For the gate line driving circuit (scanning line driving circuit) for sequentially selecting and driving the pixel lines or gate lines, a shift register that performs one cycle of shift operation in one frame period of the display signal can be used.

Preferably, such a shift register, used as a gate line driving circuit, is formed of field-effect transistors of the same conductivity type so that the display apparatus can be manufactured without requiring an increased number of process steps. Accordingly, various shift registers formed only of N-type or P-type field-effect transistors, and various display apparatuses equipped with such shift registers, have been proposed (For example, see Japanese Patent Application Laid-Open No. 2004-78172, which is hereinafter referred to as Patent Document 1). The field-effect transistors can be MOS (Metal Oxide Semiconductor) transistors or Thin-Film Transistors (TFTs), for example.

A shift register used as a gate line driving circuit is formed of a cascade connection of a plurality of shift register circuits each provided for one pixel line or one gate line. In this specification, for the sake of convenience of explanation, each of the plurality of shift register circuits of a gate line driving circuit is referred to as "a unit shift register circuit". That is, the output terminal of each unit shift register circuit of the gate line driving circuit is connected to an input terminal of the next or following unit shift register circuit.

Patent Document 1 discloses a configuration of a conventional unit shift register circuit in FIG. 7. As shown in this diagram, the conventional unit shift register circuit includes a first transistor (M1) connected between an output terminal (GOUT[N]) and a clock terminal (CKV), and a second transistor (M2) connected between the output terminal and a first power-supply terminal (VOFF). A clock signal inputted to the clock terminal is transmitted to the output terminal, with the first transistor being on and the second transistor being off, so as to provide the output signal of the unit shift register circuit.

In particular, because the gate line driving circuit is required to rapidly charge and activate the gate lines with the output signals, the first transistor in each unit shift register circuit therein is required to offer a high driving capability (a capability of passing current). Accordingly, it is desired that the gate-source voltage of the first transistor be maintained high while the first transistor is on.

A third transistor (M3) is connected to a first node (N1) to which the gate of the first transistor is connected, so as to charge the first node. In the conventional unit shift register circuit, the third transistor is connected between the first node and a second power-supply terminal (VON), and its gate is connected to an input terminal of that unit shift register circuit (i.e., the output terminal (GOUT[N−1]) of the preceding unit shift register circuit). That is, the third transistor turns on when the output signal of the preceding unit shift register circuit is activated, and supplies charge to the first node from a power supply connected to the second power-supply terminal to charge (pre-charge) the first node. This causes the first transistor to turn on, and the clock signal which attains its H level thereafter is transmitted to the output terminal, so as to provide the output signal.

In the shift register circuit of Patent Document 1, a capacitive element (C) is connected between the first node and the output terminal, or the source of the first transistor. Accordingly, the first node is boosted by the coupling through the capacitive element when the first transistor is turned on by the pre-charging of the first node and the output terminal thereafter goes to the H level in response to the clock signal, whereby the gate-source voltage of the first transistor is kept high. As a result, the first transistor has a high driving capability.

However, while the first node is boosted, the gate-source voltage of the first transistor is not increased over the level it exhibited before being boosted, but is just kept approximately unchanged. That is, the driving capability of the first transistor of the unit shift register circuit is determined by the gate-source voltage that is given during the pre-charging by the third transistor. That is, enhancing the driving capability of the first transistor requires charging the first node to a sufficiently high level during the pre-charging.

Theoretically, when the potential at the second power-supply terminal is VDD and the threshold voltage of the third transistor is Vth, the potential at the first node is raised to VDD−Vth by the pre-charging. However, it is difficult to raise the first node to the maximum pre-charge level (VDD−Vth) when the frequency of the clock signal is high and the pulse width of the input signal (the output signal of the preceding unit shift register circuit) is narrow. One reason thereof is that the third transistor (M3) operates in a source follower mode when pre-charging the first node. That is, as the level at the first node rises, the gate-source voltage of the third transistor becomes smaller, and so the driving capability of the third transistor becomes smaller as the first node is charged, and the rate of rise of the level is therefore considerably lowered.

That is, in the conventional unit shift register circuit, the gate of the first transistor (the first node) is pre-charged by the third transistor operating in a source follower mode, and therefore charging the first node to the maximum pre-charge level takes a relatively long time. Accordingly, the first node cannot be sufficiently pre-charged when the clock signal frequency is high, which results in a reduced driving capability of the first transistor. This problem is particularly serious for the gate line driving circuit, because it has to rapidly charge and activate the gate lines with the output signals of the unit shift register circuits and therefore it requires first transistors having a high driving capability. That is, the achievement of higher resolution of the display apparatus is hindered because it is difficult to speed up the operation of the gate line driving circuit by increasing the frequency of the clock signal.

SUMMARY OF THE INVENTION

An object of the present invention is to provide a shift register circuit that is capable of suppressing a reduction of a driving capability even with a high clock signal frequency.

According to a first aspect of the present invention, a shift register circuit includes first to third transistors, a charging circuit, and a boosting circuit as described below. The first transistor supplies to an output terminal a clock signal inputted to a clock terminal. The second transistor discharges the output terminal. The third transistor supplies a potential at a power-supply terminal to a first node to which the control electrode of the first transistor is connected. The charging circuit charges a second node to which the control electrode of the third transistor is connected, on the basis of a signal inputted to a given first input terminal. The boosting circuit boosts the second node that has been charged, on the basis of a signal inputted to a given second input terminal.

The charging circuit charges the second node, and the boosting circuit further boosts the second node, and so the first node is charged (pre-charged) with the control electrode of the third transistor kept at a high level. At this time, the third transistor performs a non-saturated operation, and therefore the level at the first node rapidly rises. Accordingly, even when the clock signal frequency is high and the pulse width of the signals inputted to the first and second input terminals is narrow, it is possible to sufficiently pre-charge the first node. That is, it is possible to prevent a reduction of the driving capability of the first transistor. Also, because the third transistor performs a non-saturated operation, a loss corresponding to its threshold voltage does not occur. Thus, the first node is pre-charged to a higher level than in conventional techniques, and the driving capability of the first transistor is higher than in conventional techniques.

According to a second aspect of the present invention, a shift register circuit includes first and second transistors, a charging circuit, and a boosting circuit as described below. The first transistor supplies to an output terminal a clock signal inputted to a clock terminal. The second transistor discharges the output terminal. The charging circuit charges a first node to which the control electrode of the first transistor is connected, on the basis of a signal inputted to a given first input terminal. The boosting circuit boosts the first node that has been charged, on the basis of a signal inputted to a given second input terminal.

The charging circuit charges the first node, and the boosting circuit further boosts the first node. Accordingly, even when the clock signal frequency is high and the pulse width of the signals inputted to the first and second input terminals is narrow, it is possible to pre-charge the first node to a sufficiently high level. That is, it is possible to prevent a reduction of the driving capability of the first transistor. Also, because the first node is pre-charged by the boosting circuit to a higher level than in conventional techniques, the driving capability of the first transistor is higher than in conventional techniques.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram illustrating the configuration of a gate line driving circuit according to a first preferred embodiment;

FIG. 3 is a circuit diagram illustrating the configuration of a unit shift register circuit of the first preferred embodiment;

FIG. 7 is a circuit diagram illustrating the configuration of a unit shift register circuit according to a third preferred embodiment;

FIG. 11 is a circuit diagram illustrating the configuration of a unit shift register circuit according to a sixth preferred embodiment;

FIG. 14 is a circuit diagram illustrating the configuration of a unit shift register circuit according to an eighth preferred embodiment;

FIG. 15 is a circuit diagram illustrating the configuration of a unit shift register circuit according to a ninth preferred embodiment;

FIG. 16 is a circuit diagram illustrating the configuration of a unit shift register circuit according to a tenth preferred embodiment;

FIG. 17 is a circuit diagram illustrating the configuration of a voltage generating circuit of the tenth preferred embodiment;

FIG. 18 is a circuit diagram illustrating the configuration of a voltage generating circuit according to an eleventh preferred embodiment;

FIG. 24 is a circuit diagram illustrating the configuration of a voltage generating circuit according to a sixteenth preferred embodiment;

FIG. 26 is a circuit diagram illustrating the configuration of a unit shift register circuit according to the seventeenth preferred embodiment.

DESCRIPTION OF THE PREFERRED EMBODIMENTS

Figure 1:
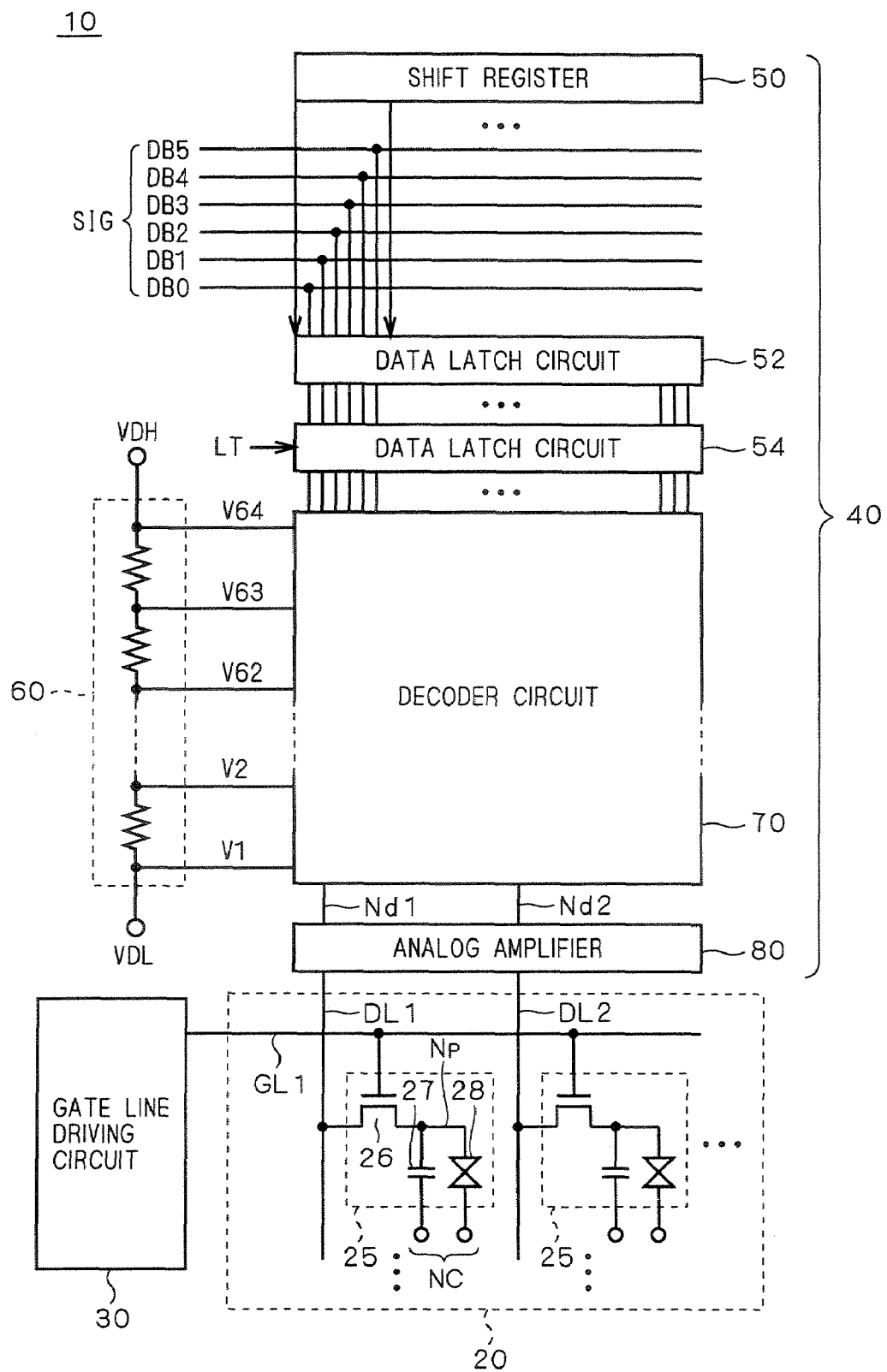
FIG. 1 is a schematic block diagram illustrating the configuration of a display apparatus according to a preferred embodiment of the present invention.

The preferred embodiments of the present invention will now be described referring to the drawings. In the drawings, in order to avoid repetitions and redundancies of explanation, components having the same or corresponding functions are shown at the same reference characters.

First Preferred Embodiment

FIG. 1 is a schematic block diagram illustrating the configuration of a display apparatus according to a first preferred embodiment of the present invention, where the entire configuration of a liquid-crystal display apparatus 10 is illustrated as a typical example of a display apparatus.

The liquid-crystal display apparatus 10 includes a liquid-crystal array 20, a gate line driving circuit (a scanning line driving circuit) 30, and a source driver 40. As will be clearly understood from the following description, the shift registers of the preferred embodiments of the present invention are provided in the gate line driving circuit 30.

The liquid-crystal array 20 includes a plurality of pixels 25 that are arranged in rows and columns. Gate lines GL1, GL2 . . . (collectively referred to as "gate lines GL") are provided respectively for the rows of pixels (hereinafter referred to also as "pixel lines"), and data lines DL1, DL2 . . . (collectively referred to as "data lines DL") are provided respectively for the columns of pixels (hereinafter referred to also as "pixel columns"). By way of illustration, FIG. 1 only shows the pixels 25 that are disposed in the first and second columns in the first row, and the corresponding gate line GL1 and data lines DL1 and DL2.

Each pixel 25 includes a pixel switch element 26 disposed between the corresponding data line DL and a pixel node Np, and a capacitor 27 and a liquid-crystal display element 28 connected in parallel between the pixel node Np and a common electrode node NC. The orientation of the liquid crystals in the liquid-crystal display element 28 changes according to a voltage difference between the pixel node Np and the common electrode node NC, and the display luminance of the liquid-crystal display element 28 changes in response thereto. It is thus possible to control the luminance of each pixel with a display voltage that is transmitted to the pixel node Np through the data line DL and the pixel switch element 26. That is, intermediate luminance can be obtained by applying voltage difference intermediate between the maximum-luminance voltage difference and the minimum-luminance voltage difference, across the pixel node Np and the common electrode node NC. Thus, graduated luminance can be obtained by setting the display voltage in a graduated manner.

The gate line driving circuit 30 sequentially selects and drives the gate lines GL according to a predetermined canning period. The gate electrodes of the pixel switch elements 26 are connected respectively to the corresponding gate lines GL. While a particular gate line GL is being selected, the pixel switch elements 26 in the pixels connected thereto are made conductive, so as to connect the pixel nodes Np to the corresponding data lines DL. Then, the display voltages transmitted to the pixel nodes Np are held in the capacitors 27. In general, the pixel switch elements 26 are formed of TFTs that are formed on the same insulating substrate with the liquid-crystal display elements 28 (a glass substrate, a resin substrate, or the like).

The source driver 40 is provided to output the display voltages to the data lines DL, where the display voltages are set in a graduated manner by a display signal SIG provided as an N-bit digital signal. Herein, for the sake of illustration, it is assumed that the display signal SIG is a 6-bit signal, including display signal bits DB0 to DB5. With the 6-bit display signal SIG, each pixel can display gradations of $2^6=64$ levels. When a single color display unit is formed of three pixels of R (Red), G (Green) and B (Blue), it is possible to display about 260,000 colors.

As shown in FIG. 1, the source driver 40 includes a shift register 50, data latch circuits 52 and 54, a gradation voltage generating circuit 60, a decoder circuit 70, and an analog amplifier 80.

As to the display signal SIG, the display signal bits DB0 to DB5, corresponding to the display luminance of the pixels 25, are serially generated. That is, the display signal bits DB0 to DB5 at each time indicates the display luminance of one pixel 25 in the liquid-crystal array 20.

The shift register 50 instructs the data latch circuit 52 to capture the display signal bits DB0 to DB5 according to a timing that is synchronized with the cycle of change of the setting of the display signal SIG. The data latch circuit 52 sequentially captures the serially generated display signal SIG, and holds the display signal SIG corresponding to one pixel line.

The data latch circuit 54 receives a latch signal LT that is activated according to the timing by which the data latch circuit 52 captures one pixel line of display signal SIG. In response thereto, the data latch circuit 54 captures the one pixel line of display signal SIG that is held in the data latch circuit 52 at that moment.

The gradation voltage generating circuit 60 is formed of 63 voltage-division resistors connected in series between a high voltage VDH and a low voltage VDL, and generates 64 levels of gradation voltages, V1 to V64.

The decoder circuit 70 decodes the display signal SIG held in the data latch circuit 54. Then, according to the decoded results, the decoder circuit 70 selects and outputs voltage levels to be outputted to individual decoder output nodes Nd1, Nd2 . . . (collectively referred to as "decoder output nodes Nd") from among the gradation voltages V1 to V64.

As a result, the display voltages (selected from the gradation voltages V1 to V64) that correspond to one pixel line of display signal SIG held in the data latch circuit 54 are outputted simultaneously (in parallel) to the decoder output nodes Nd. For the sake of illustration, FIG. 1 only shows the decoder output nodes Nd1 and Nd2 that correspond to the data lines DL1 and DL2 disposed in the first and second columns.

The analog amplifier 80 produces analog voltages that correspond to the display voltages outputted from the decoder circuit 70 to the decoder output nodes Nd1, Nd2 . . . , and outputs them onto the data lines DL1, DL2 . . .

The source driver 40 thus produces the display voltages corresponding to the series of display signals SIG, and repeatedly outputs the display voltages to the data lines DL according to the predetermined scanning period, one pixel line at a time. The gate line driving circuit 30 sequentially drives the gate lines GL1, GL2 . . . in synchronization with the scanning period, so as to cause the liquid-crystal array 20 to display an image based on the display signal SIG.

FIG. 1 illustrates the configuration of the liquid-crystal display apparatus 10 in which the gate line driving circuit 30 and the source driver 40 are fabricated as one structure together with the liquid-crystal array 20, but the gate line driving circuit 30 and the source driver 40 may be provided as circuitry external to the liquid-crystal array 20.

FIG. 2 is a diagram illustrating the configuration of the gate line driving circuit 30. The gate line driving circuit 30 is formed of a shift register including a plurality of cascade-connected unit shift register circuits SR1, SR2, SR3, SR4 . . . (for the sake of convenience, the cascade-connected shift register circuits SR1, SR2 . . . are collectively referred to as "unit shift register circuits SR"). One unit shift register circuit SR is provided for one pixel line, i.e. for one gate line GL.

A clock generator 31 shown in FIG. 2 generates three-phase clock signals CLK1, CLK2, and CLK3 having different phases, and inputs them to the unit shift register circuits SR of the gate line driving circuit 30. The clock signals CLK1, CLK2 and CLK3 are controlled such that they are activated in this order in synchronization with the scanning period of the display apparatus.

Each unit shift register circuit SR has a clock terminal CK, a reset terminal RST, an output terminal OUT, a first input terminal IN1, and a second input terminal IN2. As shown in FIG. 2, the clock terminal CK of each unit shift register circuit SR is supplied with a predetermined one of the clock signals CLK1, CLK2 and CLK3 outputted from the clock generator 31. More specifically, the clock signal CLK1 is supplied to the (3n−2)th unit shift register circuits SR1, SR4, SR7 . . . , the clock signal CLK2 is supplied to the (3n−1)th unit shift register circuits SR2, SR5, SR8 . . . , and the clock signal CLK3 is supplied to the (3n)th unit shift register circuits SR3, SR6, SR9 . . . As mentioned above, the clock signals CLK1, CLK2 and CLK3 are activated in this order, and so the clock terminals CK of the shift register circuits SR1, SR2, SR3 . . . are activated in that order. The reset terminal RST of each unit shift register circuit SR is connected to the output terminal OUT of the unit shift register circuit SR of the next stage.

The first and second input terminals IN1 and IN2 of the first-stage unit shift register circuit SR1 respectively receive first and second start pulses SP1 and SP2 as their input signals. In this preferred embodiment, the first and second start pulses SP1 and SP2 both go to an H level according to a timing that corresponds to the beginning of a frame period of the image signal, but they are shifted in phase. That is, the first start pulse SP1 goes to the H level earlier than the second start pulse SP2, and the second start pulse SP2 goes to the H level after the first start pulse SP1 has returned to the L level.

In the unit shift register circuit SR2 of the second stage, the first input terminal IN1 receives the second start pulse SP2, and its second input terminal IN2 is connected to the output terminal OUT of the first-stage unit shift register circuit SR1. In the unit shift register circuits SR of the third and following stages, the first input terminal IN1 is connected to the output terminal OUT of the unit shift register circuit SR that is two stages previous thereto (the stage that precedes the immediately preceding stage), and the second input terminal IN2 is connected to the output terminal OUT of the immediately preceding unit shift register circuit SR. The output signals outputted to the output terminals OUT of the individual unit shift register circuits SR are outputted respectively onto the corresponding gate lines GL as horizontal (or vertical) scanning pulses.

In the gate line driving circuit 30 of the preferred embodiment shown in FIG. 2, individual unit shift register circuits SR shift and transmit the signals inputted to the first and second input terminals IN1 and IN2 (the start pulses or output signals from preceding stages) to the corresponding gate lines GL and following unit shift register circuits SR, in synchronization with the clock signals CLK1, CLK2, and CLK3 (the operation of the unit shift register circuits SR will be fully described later). As a result, the series of unit shift register circuits SR function as "a gate line driving unit" that sequentially activates the gate lines GL according to a timing based on a predetermined scanning period.

FIG. 3 is a circuit diagram illustrating the configuration of one unit shift register circuit SR of the first preferred embodiment of the present invention. The configuration of one unit shift register circuit SR will be described below because the cascade-connected individual unit shift register circuits SR of the gate line driving circuit 30 are configured substantially the same. The transistors constituting the unit shift register circuits SR are all field-effect transistors of the same conductivity type, and the preferred embodiments described below assume that they are all N-type TFTs.

As shown in FIG. 3, the unit shift register circuit SR has the first and second input terminals IN1 and IN2, the clock terminal CK, the reset terminal RST, and the output terminal OUT as shown in FIG. 2, and further has a first power-supply terminal s1 supplied with a low power-supply potential VSS, and a second power-supply terminal s2 and a third power-supply terminal s3 supplied respectively with high power-supply potentials VDD1 and VDD2. The high power-supply potentials VDD1 and VDD2 may be at the same level. In the description below, the low power-supply potential VSS is used as the circuit's reference potential, but, in real use, the reference potential is set on the basis of the voltage of data written to pixels. For example, the high power-supply potentials VDD1 and VDD2 may be set at 17 V, and the low power-supply potential VSS may be set at −12 V.

The output stage of the unit shift register circuit SR includes a transistor Q1 connected between the output terminal OUT and the clock terminal CK, and a transistor Q2 connected between the output terminal OUT and the first power-supply terminal s1. That is, the transistor Q1 is a first transistor that supplies the output terminal OUT with the clock signal inputted to the clock terminal CK, and the transistor Q2 is a second transistor that supplies the output terminal OUT with the potential of the first power-supply terminal s1. As shown in FIG. 3, the node to which the gate (control electrode) of the transistor Q1 is connected is defined as a node N1 (a first node), and the node to which the gate of the transistor Q2 is connected is defined as a node N2.

A capacitive element C1 for boosting (a boosting capacitance) is provided between the gate and source of the transistor Q1 (i.e., between the output terminal OUT and the node N1). A transistor Q3 (a third transistor) for supplying the potential of the second power-supply terminal s2 to the node N1 is connected between the node N1 and the second power-supply terminal s2. A transistor Q4 is connected between the node N1 and the first power-supply terminal s1. The gate of the transistor Q4 is connected to the node N2. The gate node of the transistor Q3 is defined as a node N3 (a second node).

A transistor Q8 is connected between the node N3 and the second power-supply terminal s2, and its gate is connected to the first input terminal IN1. A capacitive element C2 is connected between the node N3 and the second input terminal IN2. A transistor Q5 and a transistor Q9 are connected between the node N3 and the first power-supply terminal s1. The gate of the transistor Q5 is connected to the reset terminal RST, and the gate of the transistor Q9 is connected to the node N2.

A diode-connected transistor Q6 is connected between the node N2 and the third power-supply terminal s3, and a transistor Q7 is connected between the node N2 and the first power-supply terminal s1. The gate of the transistor Q7 is connected to the node N3.

The driving capability (the capability of passing current) of the transistor Q7 is set sufficiently larger than that of the transistor Q6. That is, the on-state resistance of the transistor Q7 is sufficiently smaller than the on-state resistance of the transistor Q6. Accordingly, the potential at the node N2 falls when the gate potential of the transistor Q7 rises, and the potential at the node N2 rises when the gate potential of the transistor Q7 falls. That is, the transistor Q6 and the transistor Q7 form a ratio-type inverter whose operation is defined by the ratio between their on-state resistance values. The node N3 forms the input end of this inverter and the node N2 forms its output end, and it constitutes "a pull-down driving circuit" that drives the transistor Q2 to pull down the output terminal OUT.

Figure 4:
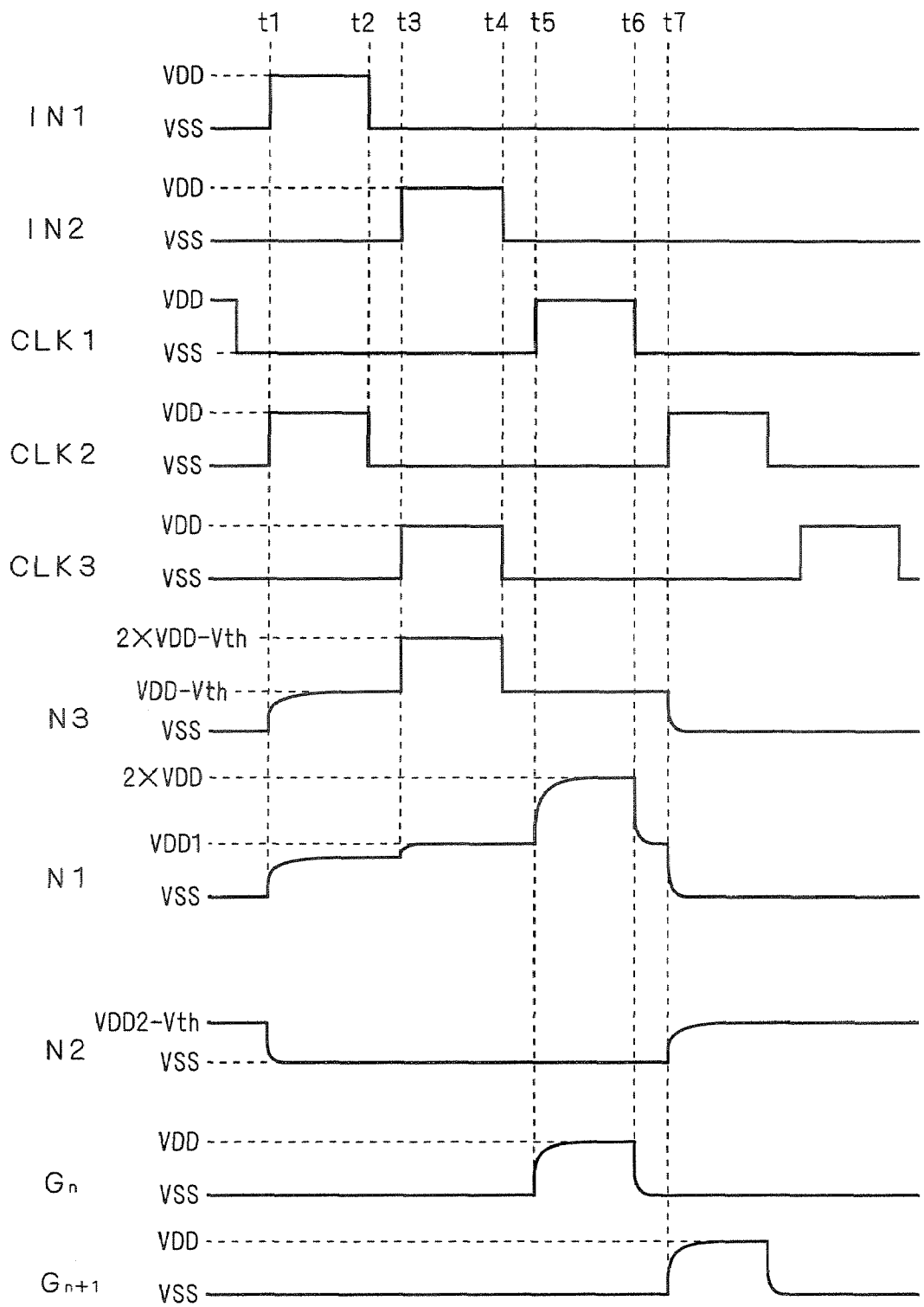
FIG. 4 is a timing chart illustrating the operation of the unit shift register circuit of the first preferred embodiment.

FIG. 4 is a timing chart illustrating the operation of the unit shift register circuits of the first preferred embodiment. The specific operation of the unit shift register circuits SR of the preferred embodiment will be described referring to FIG. 4, where, again, the operation of one unit shift register circuit SR will be described because the individual unit shift register circuits SR of the gate line driving circuit 30 operate substantially the same. For the sake of simplicity, the description assumes that the clock signal CLK1 is inputted to the clock terminal CK of the unit shift register circuit SR (for example, this corresponds to the unit shift register circuits SR1 and SR4 of FIG. 2).

Now, the gate line driving signal that is outputted from this unit shift register circuit SR is defined as $G_n$, the output signals of the unit shift register circuits SR that are one stage previous thereto, and two stages previous thereto, are defined respectively as $G_{n-1}$ and $G_{n-2}$, and the gate line driving signal outputted from the next-stage unit shift register circuit SR is defined as $G_{n+1}$. For the sake of simplicity of description, it is assumed that the H levels of the clock signals CLK1, CLK2, CLK3, and the first start pulse SP1 and the second start pulse SP2 are all equal, and this level is expressed as VDD. It is also assumed that this level VDD is equal to the level of the high power-supply potential VDD1 (i.e., VDD=VDD1).

First, in an initial state, suppose that the node N1 and the node N3 are at an L (Low) level (VSS), and the node N2 is at an H (High) level (VDD2−Vth (Vth: transistor's threshold voltage)) (this state is hereinafter referred to as "a reset state"). Also, suppose that the clock terminal CK (clock signal CLK1), the reset terminal RST (the output signal $G_{n+1}$ from the next stage), the first input terminal IN1 (the output signal $G_{n-2}$ of the circuit that is two stages previous), and the input terminal IN2 (the output signal $G_{n-1}$ of the immediately preceding stage) are all at an L level. In the reset state, the transistor Q1 is off (cut-off) and the transistor Q2 is on (conducting), and so the output terminal OUT (the gate line driving signal $G_n$) is kept at an L level, independently of the level of the clock terminal CK (the clock signal CLK1). That is, the gate line connected to this unit shift register circuit SR is in an unselected state.

In this state, at time t1, the output signal $G_{n-2}$ of the two-stages-previous circuit (or the first start pulse SP1 in the case of the first-stage unit shift register circuit SR1) goes to the H level, and it is inputted to the first input terminal IN1 of the unit shift register Circuit SR, and then the transistor Q8 turns on. At this moment, the node N2 is at the H level and so the transistor Q9 is also on, but the node N3 is charged to a raised level by electric charge supplied through the transistor Q8, because the driving capability of the transistor Q8 is sufficiently larger than the driving capability of the transistor Q9 and the on-state resistance of the transistor Q8 is sufficiently lower than the on-state resistance of the transistor Q9. That is, the transistor Q8 functions as a charging circuit that charges the node N3 connected to the gate of the transistor Q3, on the basis of the signal inputted to the first input terminal IN1.

As the level at the node N3 rises, the transistor Q7 starts conducting, and the level at the node N2 falls. Then, the resistance of the transistor Q9 increases and the level at the node N3 rapidly rises. In response, the transistor Q7 sufficiently turns on. As a result, the node N2 goes to the L level (VSS), the transistor Q9 turns off, and the node N3 goes to an H level.

While raising the level at the node N3 requires charging the capacitive element C2 and the gate-channel capacitance (gate capacitance) of the transistor Q3 connected thereto, the node N3 can be rapidly charged because their capacitance values are as small as about ⅕ to ⅒ as compared with the values of the transistor Q1 and the capacitive element C1 of the output stage. Accordingly, the level at the node N3 quickly rises to the logical value, though the transistor Q8 operates in a source follower mode where high-speed charging is difficult. That is, the level V3a at the node N3 after charged by the transistor Q8 is given as:

$$V3a \approx VDD - Vth \quad (1)$$

When the node N3 attains the H level, the transistor Q3 turns on in response. At this time, the node N2 is at the L level and the transistor Q2 is off, and the level at the node N1 rises.

It is difficult to rapidly charge the node N1, because raising the level at the node N1 requires charging the capacitive element C1 and the gate capacitance of the transistor Q1 whose capacitance values are relatively large as mentioned above. Also, it is difficult to raise the level at the node N1 to the logical value (VDD−2×Vth) in a short time, because the transistor Q3 operates in a source follower mode. Accordingly, the level at the node N1 at this moment rises only to a certain level that is lower than the logical value, unless the output signal $G_{n-2}$ of the two-stages-previous circuit has a sufficiently large pulse width.

At time t2, the output signal $G_{n-2}$ from the two-stages-previous circuit goes back to the L level and the transistor Q8 turns off. After that, the levels are maintained because the node N1 and the node N3 enter a floating state and the transistors Q7 and Q9 work as a flip-flop.

Then, at time t3, the output signal $G_{n-1}$ of the immediately preceding stage (or the second start pulse SP2 in the case of the first-stage unit shift register circuit SR1) goes to the H level, and the second input terminal IN2 of the unit shift register circuit SR goes to the H level, and the node N3 is boosted by the capacitive coupling through the capacitive element C2. That is, the capacitive element C2 functions as a boosting circuit that boosts the charged node N3 on the basis of the signal inputted to the second input terminal IN2.

After boosted by the capacitive element C2, the level at the node N3 is raised by the amplitude VDD of the output signal $G_{n-1}$ of the preceding stage, over the level it exhibited before boosted. That is, the level V3b at the node N3 at this moment is given as:

$$V3b \approx 2 \times VDD - Vth \quad (2)$$

In this condition, the voltage between the gate (node N3) and the source (node N1) of the transistor Q3 is sufficiently high, and the transistor Q3 charges the node N1 not in a source follower mode but with an operation in the non-saturated region (non-saturated operation). Accordingly, the node N1 is rapidly charged to an H level, and the level at the node N1 attains VDD1 without a loss corresponding to the threshold voltage Vth. In the state in which the node N1 and the node N3 are at the H level and the node N2 is at the L level (this state is hereinafter referred to as "a set state"), the transistor Q1 is on and the transistor Q2 is off.

After that, at time t4, the output signal $G_{n-1}$ of the preceding stage goes back to the L level, and the second input terminal IN2 goes to the L level, and the level at the node N3 follows it to fall back to VDD−Vth or the level it exhibited before boosted. Then, the level at the node N1 is VDD1 (=VDD), and so the transistor Q3 turns off, and the node N1 is placed in a floating state and its level is kept at VDD1 after that (accordingly, the set state is maintained).

In a conventional unit shift register circuit, the charging of the node N1 involves the loss corresponding to the threshold voltage of the charging transistor (for example, the transistor M3 of Patent Document 1), and therefore the node N1 is raised only to VDD1−Vth even when the clock signal has a sufficiently long pulse width. That is, in the preferred embodiment, the node N1 can be charged to a level that is higher than the conventional one by Vth or more.

In the unit shift register circuit SR being in the set state, the transistor Q1 is on and the transistor Q2 is off, and the level of the output signal $G_n$ at the output terminal OUT rises when the clock signal CLK1 at the clock terminal CK attains the H level at time t5. Then, the level at the node N1 is raised by a particular voltage due to the capacitive coupling through the capacitive element C1 and the gate capacitance of the transistor Q1 (accordingly, the node N1 can be referred to as "a boosted node").

When it is assumed that the parasitic capacitance value of the node N1 is sufficiently smaller than the sum of the capacitance values of the gate capacitance of the transistor Q1 and the capacitive element C1, then the level at the node N1 boosted in response to the output signal $G_n$ is equal to VDD1+ VDD (=2×VDD). As a result, the gate-source voltage of the transistor Q1 is kept large, and the level of the output terminal OUT, i.e., the output signal $G_n$, rapidly rises following the clock signal CLK1. Also, at this time, the transistor Q1 performs a non-saturated operation, without involving the loss of threshold voltage Vth, and so the H level of the output signal $G_n$ is VDD which is equal to the H level of the clock signal CLK1.

The output signal $G_n$ that attained the H level at time t5 maintains the H level and activates the gate line while the clock signal CLK1 is at the H level. Then, at time t6, the clock signal CLK1 goes back to the L level, and then the gate line driving signal $G_n$ also goes to the L level, so as to return to the gate line unselecting state. At this time, the level at the node N1 also falls to VDD1, or the level that it exhibited before boosted.

After that, at time t7 at which the clock signal CLK2 attains the H level, the gate line driving signal $G_{n+1}$ of the next stage attains the H level, which is inputted to the reset terminal RST to turn on the transistor Q5. Then, the level at the node N3 falls and the transistor Q7 turns off, and the node N2 goes to the H level. In response, the transistors Q4 and Q9 turn on, and the nodes N1 and N3 go to the L level. As a result, the circuit returns to the reset state where the transistor Q1 is off and the transistor Q2 is on.

The operations described so far can be summarized as follows. According to the preferred embodiment, while no signals are inputted to the first input terminal IN1 and the second input terminal IN2, the unit shift register circuit SR is in a reset state where the node N1 is at the L level (VSS) and the node N2 is at the H level (VDD2−Vth). In this period, the transistor Q1 is off and the transistor Q2 is on, and therefore the output terminal OUT is maintained at the low-impedance L level (VSS). Then, when the pulse signals are inputted to the first input terminal IN1 and the second input terminal IN2 in this order, the unit shift register circuit SR enters a set state where the node N2 is at the L level (VSS) and the node N1 is at the H level (VDD1). In the set state, the transistor Q1 is on and the transistor Q2 is off, and the gate line output terminal OUT stays at the H level and activates the gate line while the signal at the clock terminal CK (clock signal CLK1) is at the H level. After that, the signal at the reset terminal RST (the gate line driving signal $G_{n+1}$ of the next stage) is inputted, and then the unit shift register circuit RS returns to the reset state where the node N1 and the node N3 are at the L level and the node N2 is at the H level.

Figure 5:
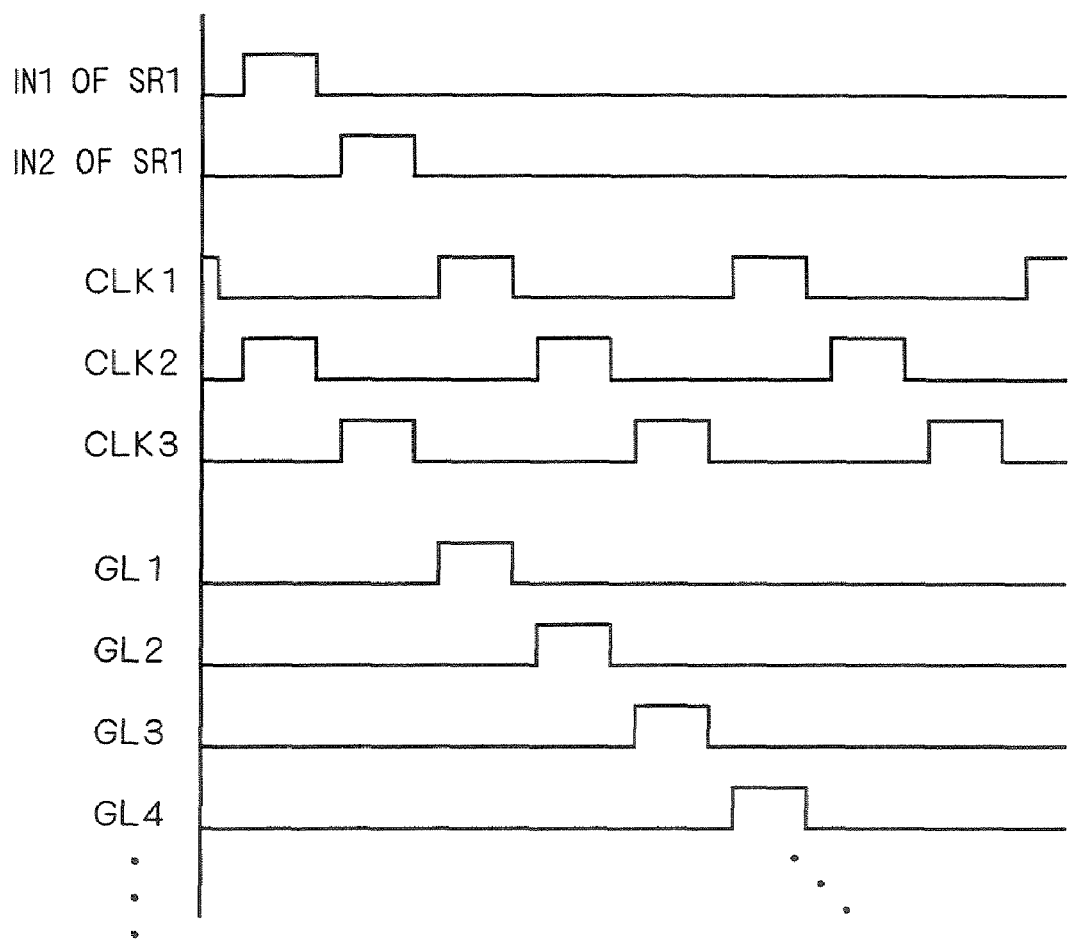
FIG. 5 is a timing chart illustrating the operation of the gate line driving circuit of the first preferred embodiment.

When a plurality of unit shift register circuits SR, each operating as described above, are cascade-connected as shown in FIG. 2, the gate line driving circuit 30 operates as shown in the timing chart of FIG. 5. As shown, the input signals (start pulses) are inputted to the first and second input terminals IN1 and IN2 of the first-stage unit shift register circuit SR1, and then the output signal G1 of the first-stage unit shift register circuit SR1 is shifted in synchronization with the clock signals CLK1, CLK2, and CLK3 and sequentially outputted as the gate line driving signals $G_1, G_2, G_3$ . . . to the gate lines GL1, GL2, GL3 . . . , and also sequentially transmitted to the unit shift register circuits SR2, SR3 . . . The gate line driving circuit 30 thus sequentially drives the gate lines GL1, GL2, GL3 . . . according to a predetermined scanning period.

It should be noted that, in the gate line driving circuit 30 configured as shown in FIG. 2, each unit shift register circuit SR can enter the reset state (i.e., the initial state described before) only after the next stage has operated at least once, because the reset terminal RST of each unit shift register circuit SR receives the gate line driving signal $G_{n+1}$ of the next stage. Also, each unit shift register circuit SR cannot perform the normal operation as shown in FIG. 3 without through the reset state, and therefore it is necessary to perform a dummy operation prior to the normal operation by transmitting a dummy input signal from the first stage to the final stage of the unit shift register circuits SR. Alternatively, a reset operation of forcedly charging the node N2 may be performed prior to the normal operation, with a resetting transistor specially provided between the node N2 and the third power-supply terminal s3 (high potential power-supply) in each unit shift register circuit SR. In this case, a signal line is separately required for the resetting.

As described so far, according to the unit shift register circuits SR of the preferred embodiment, the transistor Q8 as a charging circuit charges the gate of the transistor Q3 (the node N3), and next the capacitive element C2 as a boosting circuit boosts the charged node N3, and so the node N1 is charged (pre-charged) with the gate-source voltage of the transistor Q3 being high. That is, when the node N3 is boosted, the transistor Q3 charges the node N1 by operating not in a source follower mode but with a non-saturated operation, and so the level at the node N1 rapidly rises. Accordingly, even when the clock signal frequency is high and the pulse width of the signals inputted to the first and second input terminals IN1 and IN2 is narrow, it is possible to sufficiently pre-charge the node N1 to prevent the reduction of the driving capability of the transistor Q1. Also, because the transistor Q3 performs a non-saturated operation without involving the loss corresponding to its threshold voltage, the node N1 is pre-charged to a higher level than in conventional techniques, and the driving capability of the transistor Q1 is higher than in conventional techniques. This allows higher-speed operation of the shift register circuit formed of the cascade-connected unit shift register circuits SR, and contributes to the achievement of higher resolution of the display apparatus that utilizes the gate line driving circuit formed of the shift register circuit.

Second Preferred Embodiment

Field-effect transistors, including TFTs, are devices in which, when a voltage over the threshold voltage is applied to the gate electrode, a conductive channel is formed in the semiconductor substrate right under the gate electrode with a gate insulating film between them, and the conductive channel electrically connects the drain and source to achieve a conducting state. Accordingly, a field-effect transistor in the conducting state has a certain electrostatic capacitance (gate capacitance) between the gate and channel. That is, the field-effect transistor can function as a capacitive element in which the channel in the semiconductor substrate and the gate electrode serve as two electrodes and the gate insulating film serves as a dielectric layer. Such capacitive elements are called "MOS (Metal-Oxide Semiconductor) capacitive elements".

Figure 6:
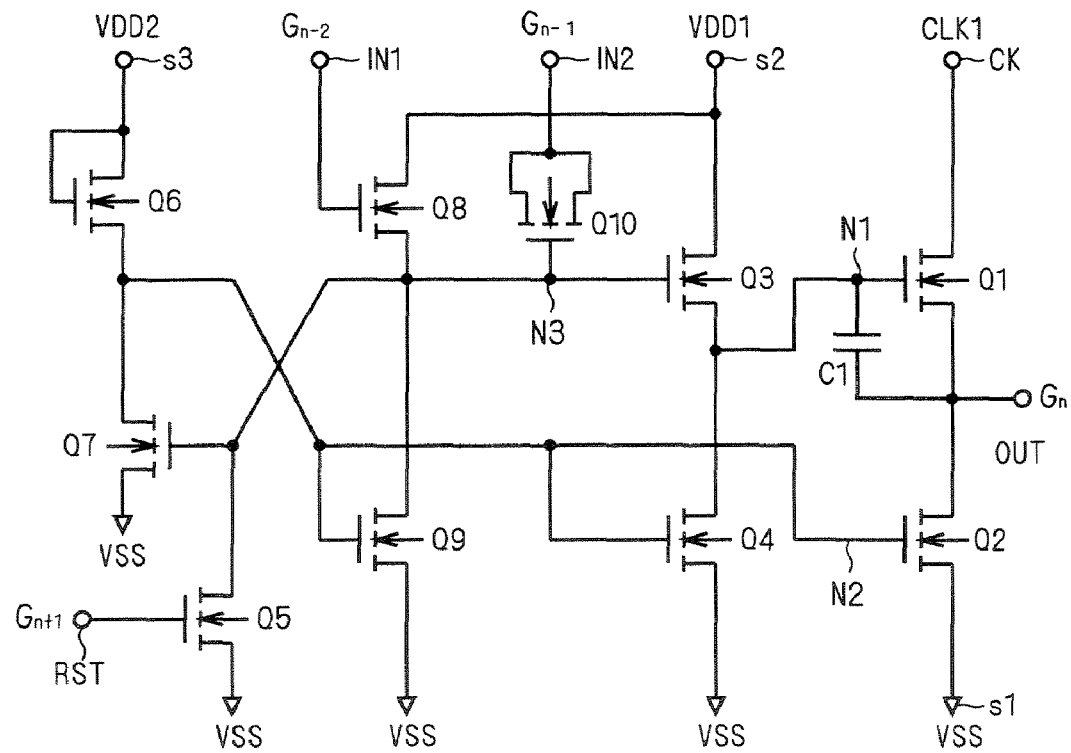
FIG. 6 is a circuit diagram illustrating the configuration of a unit shift register circuit according to a second preferred embodiment.

FIG. 6 is a circuit diagram illustrating the configuration of a unit shift register circuit SR according to a second preferred embodiment. In the first preferred embodiment, the capacitive element C2 serves as a boosting circuit for boosting the charged node N3, but this preferred embodiment utilizes the gate capacitance of a transistor Q10 instead. The gate of the transistor Q10 is connected to the node N3, and its source and drain are both connected to the second input terminal IN2. That is, the transistor Q10 functions as an MOS capacitive element.

In general, the insulating film serving as a dielectric layer of a capacitive element in a semiconductor integrated circuit has the same thickness as the gate insulating film of transistors. Accordingly, when a capacitive element is replaced by the gate capacitance of a transistor, the capacitive element can be replaced by a transistor having the same area as the capacitive element.

The unit shift register circuit SR of this preferred embodiment operates in the same way as the unit shift register circuit SR of the first preferred embodiment, because the only difference in circuit configuration is that the capacitive element C2 of the first preferred embodiment is replaced by an MOS capacitive element (the gate capacitance of the transistor Q10). Accordingly, the same effects as those of the first preferred embodiment are obtained.

The transistor Q10 works as a capacitive element only when its gate and source are biased over the threshold voltage, i.e., only when the node N3 is charged at the H level. The transistor Q10, functioning as a capacitive element only when the node N3 is at the H level, causes no problems in operation, because the transistor Q10 is provided to boost the node N3 that has been charged.

In other words, the transistor Q10 does not function as a capacitive element while the node N3 is at the L level, and therefore the node N3 is not boosted in this period even when the second input terminal IN2 attains the H level. Accordingly, the signal input to the second input terminal IN2 is not limited to the output signal $G_{n-1}$ of the preceding stage, but the clock signal that is inputted to the preceding unit shift register circuit SR may be used. For example, when the clock signal CLK1 is inputted to the clock terminal CK of that unit shift register circuit SR as shown in FIG. 3, then the clock signal CLK3 may be inputted to its second input terminal IN2.

With the circuit configuration shown in FIG. 3 of the first preferred embodiment, if the clock signal CLK1 is inputted to the clock terminal CK and the clock signal CLK3 is inputted to the second input terminal IN2, for example, then the node N3 will be undesirably boosted by the clock signal CLK3 in reset state where the node N3 should be at the L level, which might cause malfunction. This preferred embodiment is free from this problem because the transistor Q10 does not function as a capacitive element while the node N3 is at the L level.

Furthermore, inputting a clock signal to the second input terminal IN2 allows the node N3 to be boosted more rapidly, because a clock signal usually rises more rapidly than the output signals of the unit shift register circuits SR. This further increases the rate of charging (pre-charging) of the node N1. In addition, this reduces the load imposed on the output terminal OUT of each unit shift register circuit SR, and suppresses the delay of the output signal $G_n$. Thus, inputting a clock signal to the second input terminal IN2 of the unit shift register circuit SR of this preferred embodiment makes the output signal still quicker than in the first preferred embodiment.

In the circuit shown in FIG. 6, both of the source and drain of the transistor Q10 are connected to the second input terminal IN2, but only one of them may be connected to the second input terminal IN2, because they both function as an electrode of the MOS capacitive element on the same side.

Third Preferred Embodiment

In the unit shift register circuits SR of the first preferred embodiment, a charging circuit (the transistor Q8) and a boosting circuit (the capacitive element C2) are provided for the gate of the transistor Q3 (the node N3) that charges the node N1, whereby the node N3 is boosted to the level of 2×VDD−Vth. This causes the transistor Q3 to perform a non-saturated operation and so the node N1 can be rapidly charged (pre-charged).

In this preferred embodiment, this technique is applied also to the gate of the transistor Q8 that charges the node N3, where a charging circuit and a boosting circuit are provided also for the gate of the transistor Q8 so that the node N3 can be boosted to a still higher level than in the first preferred embodiment.

FIG. 7 is a circuit diagram illustrating the configuration of a unit shift register circuit according to a third preferred embodiment. In this preferred embodiment, too, the unit shift register circuit SR includes a charging circuit (a first charging circuit) that charges the node N3 on the basis of the signal inputted to the first input terminal IN1, and a boosting circuit (a first boosting circuit) that boosts the charged node N3 on the basis of the signal inputted to the second input terminal IN2. The first charging circuit of this preferred embodiment includes the transistor Q8 connected between the node N3 and the second power-supply terminal s2, and further includes a transistor Q11 connected between the second power-supply terminal s2 and a node N4 to which the gate of the transistor Q8 is connected, and a capacitive element C3 connected between the node N4 and a third input terminal IN3. The first boosting circuit is formed of the capacitive element C2 as in the first preferred embodiment.

A transistor Q12, having its gate connected to the node N2, is connected between the node N4 and the first power-supply terminal s1. In this preferred embodiment, the inverter (pull-down driving circuit) formed of the transistor Q6 and the transistor Q7 uses the node N4 as its input end and the node N2 as its output end.

A plurality of unit shift register circuits SR are cascade-connected to form a gate line driving circuit. It should be noted that, in this preferred embodiment, the first input terminal IN1 receives the output signal (defined as "$G_{n-3}$") of the three-stages-previous circuit (the circuit that is three stages previous to that circuit), the third input terminal IN3 receives the output signal $G_{n-2}$ of the two-stages-previous circuit, and the second input terminal IN2 receives the output signal $G_{n-1}$ of the immediately preceding circuit.

Also, in this preferred embodiment, the cascade-connected unit shift register circuits SR are driven by four-phase clock signals having different phases from each other. That is, the clock terminal CK of each unit shift register circuit SR receives a given one of the four-phase clocks, and the reset terminals RST of the shift register circuits SR1, SR2, SR3 . . . are activated in this order.

The first to third input terminals IN1 to IN3 of the first-stage unit shift register circuit SR1 receive three-phase start pulses, and these start pulses are activated in the order of the first input terminal IN1, the third input terminal IN3, and the second input terminal IN2.

As described in the first preferred embodiment, the unit shift register circuit SR shown in FIG. 3 charges the node N3 (the gate of the transistor Q3) to VDD−Vth (Expression (1)) with the output signal $G_{n-2}$ of the two-stages-previous circuit, and then further boosts the node N3 to 2×VDD−Vth (Expression (2)) with the output signal $G_{n-1}$ of the immediately preceding circuit, whereby the transistor Q3 performs a non-saturated operation to charge (pre-charge) the node N1 to VDD1.

On the other hand, in the unit shift register circuit SR of this preferred embodiment shown in FIG. 7, the node N4 (the gate of the transistor Q8) is charged to VDD−Vth with the output signal $G_{n-3}$ of the three-stages-previous circuit that is inputted to the first input terminal IN1. This turns on the transistor Q8, but the level at the node N3 rises only to VDD−2×Vth. However, after that, the node N4 is further boosted to 2×VDD−Vth with the output signal $G_{n-2}$ of the two-stages-previous circuit that is inputted to the third input terminal IN3. Then, the transistor Q8 performs a non-saturated operation, and the level at the node N3 is rapidly charged to VDD1 (=VDD). Accordingly, when the output signal $G_{n-1}$ of the immediately preceding stage, which is inputted to the second input terminal IN2, attains the H level (VDD), the capacitive coupling through the capacitive element C2 raises the level at the node N3 to 2×VDD, and the node N1 is rapidly charged (pre-charged) to VDD1 through the transistor Q3.

In this way, the transistor Q11 included in the first charging circuit functions as a second charging circuit that charges the node N4 on the basis of the signal inputted to the first input terminal IN1, and the capacitive element C3 functions as a second boosting circuit that boosts the charged node N4 on the basis of the signal inputted to the third input terminal IN3.

Thus, according to this preferred embodiment, thanks to the operation of the transistor Q11 and the capacitive element C3, the level at the node N3 is boosted to the level (2×VDD) that is higher by the threshold voltage Vth than that in the first preferred embodiment, and the node N1 can be charged more rapidly accordingly. This suppresses the reduction of the driving capability even when the clock signal frequency is increased and the pulse width is further narrowed. This enables higher-speed operation of the shift register circuit formed of the cascade-connected unit shift register circuits SR, and contributes to higher resolution of the display apparatus that utilizes the gate line driving circuit formed of the shift register circuit.

Figure 8:
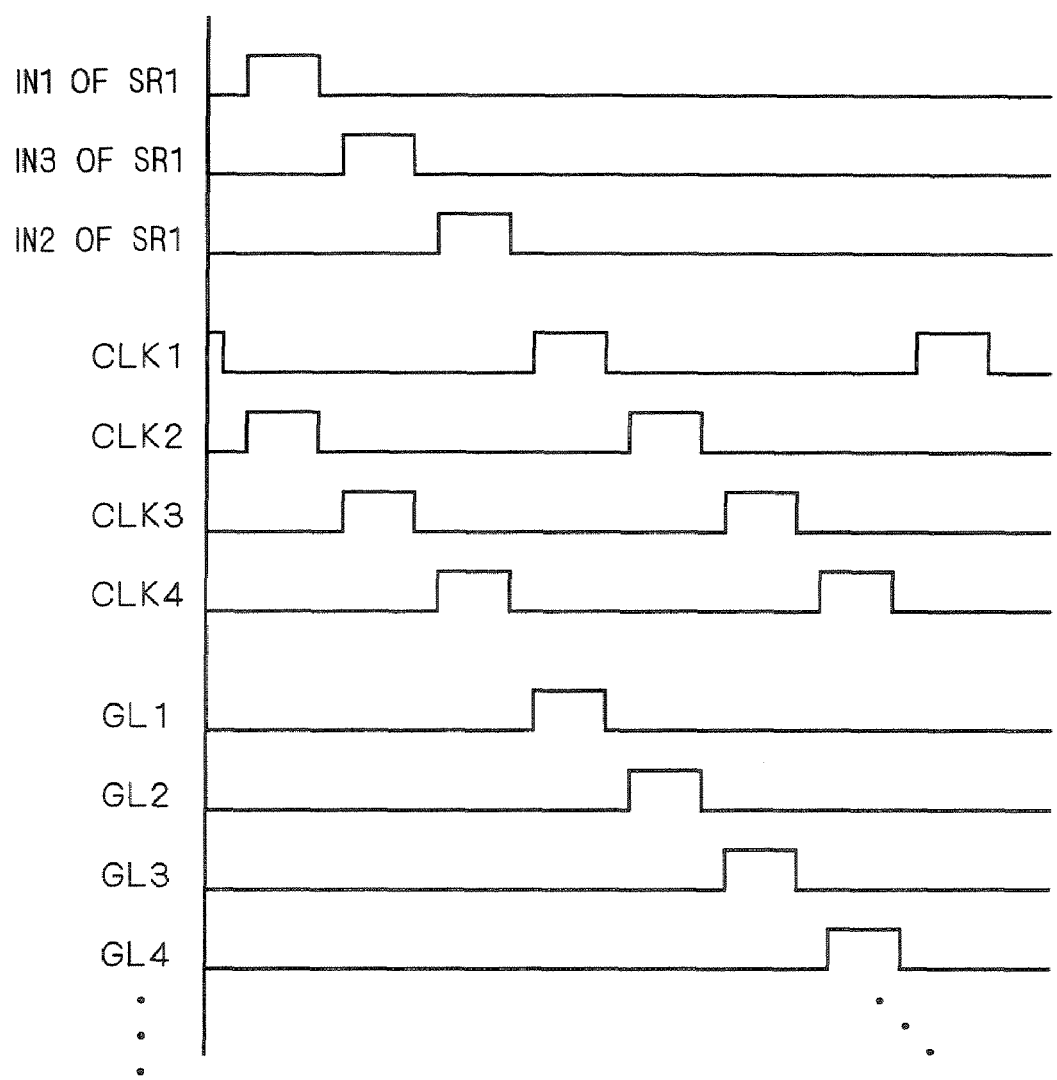
FIG. 8 is a timing chart illustrating the operation of a gate line driving circuit of the third preferred embodiment.

The unit shift register circuit SR shown in FIG. 7 operates approximately the same as that of the first preferred embodiment, except that the node N3 is charged and boosted according to the three signals inputted to the first to third input terminals IN1 to IN3. Accordingly, a gate line driving circuit formed of a cascade connection of a plurality of unit shift register circuits SR configured as shown in FIG. 7 operates as shown in the timing chart of FIG. 8. That is, the input signals (start pulses) are inputted to the first to third input terminals IN1 to IN3 of the first-stage unit shift register circuit SR1, and then the output signal G1 of the first-stage unit shift register circuit SR1 is shifted in synchronization with the clock signals CLK1 to CLK4 and sequentially outputted as the gate line driving signals $G_1$, $G_2$, $G_3$ . . . onto the gate lines GL1, GL2, GL3 . . . , and also sequentially transmitted to the unit shift register circuits SR2, SR3 . . . . The gate line driving circuit 30 thus sequentially drives the gate lines GL1, GL2, GL3 . . . according to a predetermined scanning period.

In this preferred embodiment, the first and second boosting circuits are formed respectively of the capacitive element C2 and the capacitive element C3, but the second preferred embodiment may be applied thereto to replace them with MOS capacitive elements (which is not shown as a drawing).

In this case, the circuit may be configured such that the third input terminal IN3 receives the clock signal that is inputted to the unit shift register circuit SR that is two stages previous, and the second input terminal IN2 receives the clock signal that is inputted to the immediately preceding unit shift register circuit SR. That is, when the clock signal CLK1 is inputted to the clock terminal CK of this unit shift register circuit SR, for example, then the clock signal CLK3 is inputted to its third input terminal IN3, and the clock signal CLK4 is inputted to its second input terminal IN2. As mentioned earlier, the use of the clock signals allows the node N3 and the node N4 to be boosted more rapidly, because the clock signals usually rise more rapidly than the output signals of unit shift register circuits SR. As a result, the node N1 can be charged (pre-charged) still more rapidly. In addition, the load imposed on the output terminal OUT of each unit shift register circuit SR is reduced and the delay of the output signal $G_n$ is suppressed. This further contributes to the achievement of quicker output signal.

Fourth Preferred Embodiment

As mentioned earlier, the high power-supply potentials VDD1 and VDD2 shown in the preferred embodiments may be at the same level. Accordingly, in this preferred embodiment, the second power-supply terminal s2 supplied with the high power-supply potential VDD1 and the third power-supply terminal s3 supplied with the high power-supply potential VDD2 are formed as a same terminal.

Figure 9:
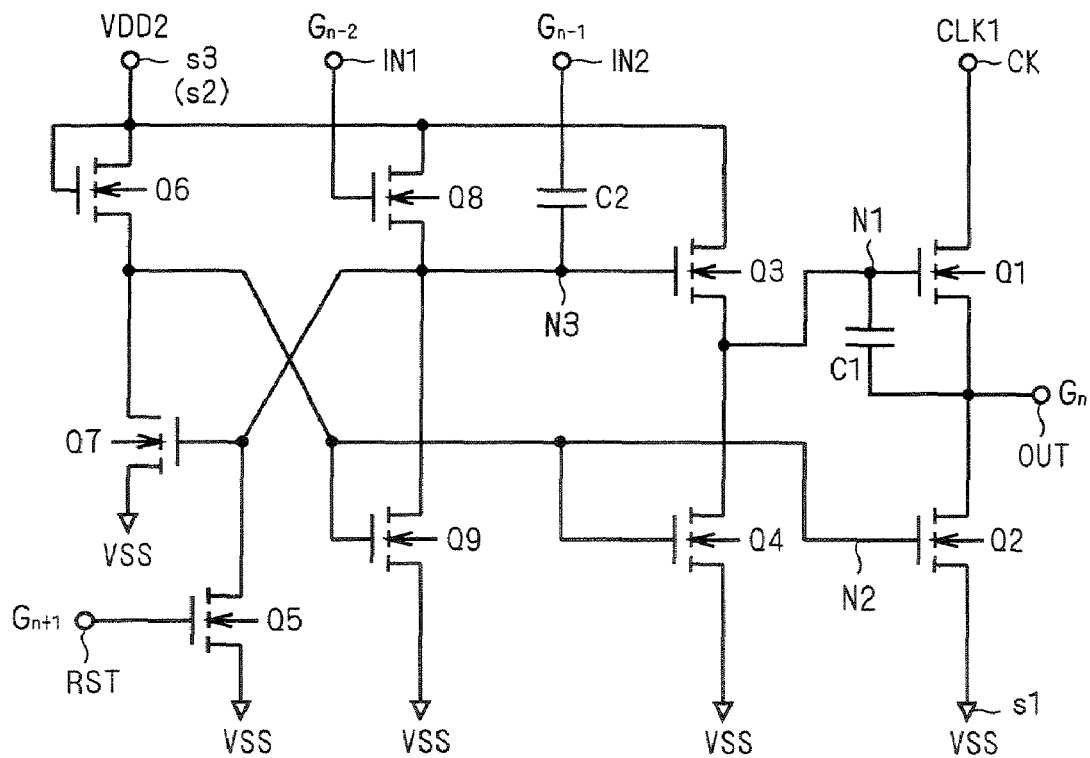
FIG. 9 is a circuit diagram illustrating the configuration of a unit shift register circuit according to a fourth preferred embodiment.

FIG. 9 is a circuit diagram of a unit shift register circuit SR of this preferred embodiment, where the second power-supply terminal s2 and the third power-supply terminal s3 of the unit shift register circuit SR of the first preferred embodiment (FIG. 3) are formed as a same terminal. Though not illustrated graphically, this preferred embodiment is applicable also to the circuit of the second preferred embodiment (FIG. 6) and the circuit of the third preferred embodiment (FIG. 7).

According to this preferred embodiment, the area required for the power-feeding interconnection is reduced, which contributes to higher integration of the gate line driving circuit, and further to the size reduction of the display apparatus.

Fifth Preferred Embodiment

As described in the second preferred embodiment, field-effect transistors, including TFTs, can function as MOS capacitive elements, where the channel formed in the semiconductor substrate in a conducting state and the gate electrode serve as two electrodes and the gate insulating film serves as a dielectric layer.

Figure 10:
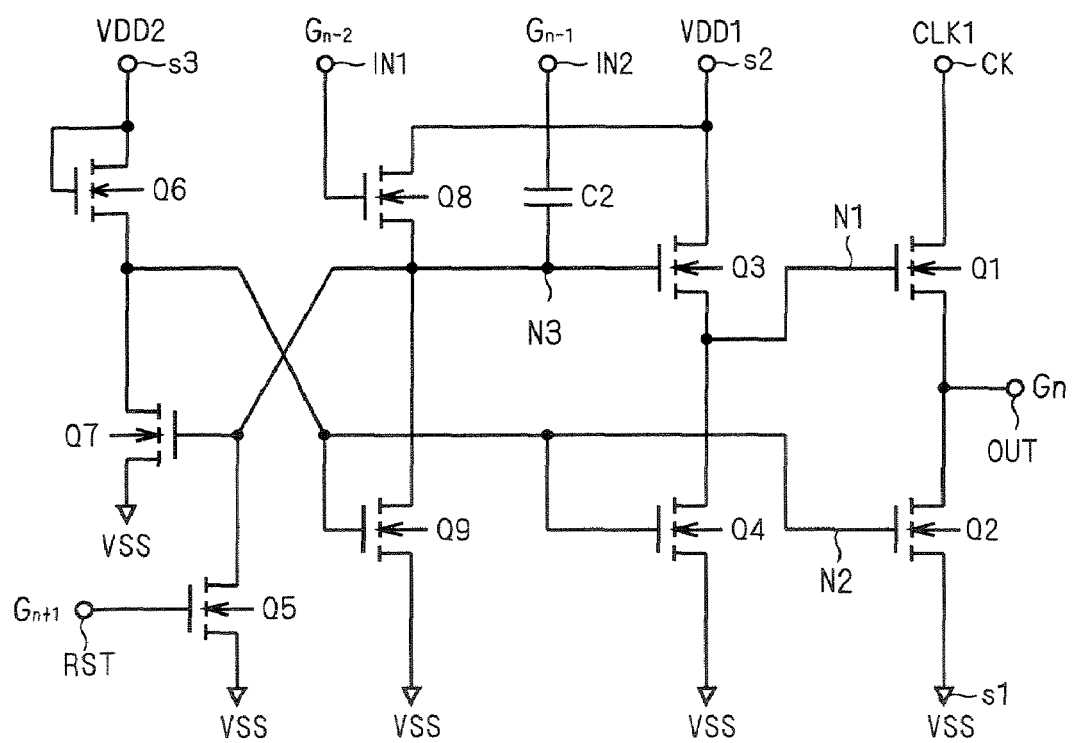
FIG. 10 is a circuit diagram illustrating the configuration of a unit shift register circuit according to a fifth preferred embodiment.

FIG. 10 is a circuit diagram illustrating the configuration of a unit shift register circuit SR according to a fifth preferred embodiment. In the first preferred embodiment, the capacitive element C1 for boosting the node N1 (a boosting capacitance) is provided between the gate and source of the transistor Q1, but it is replaced by the gate capacitance of the transistor Q1 in this preferred embodiment. In this case, the capacitive element C1 is not needed, as shown in the circuit diagram of FIG. 10.

Usually, the insulating film serving as the dielectric layer of a capacitive element formed in a semiconductor integrated circuit has the same thickness as the gate insulating film of transistors. Accordingly, when the capacitive element is replaced by the gate capacitance of a transistor, it can be replaced by a transistor having the same area as the capacitive element. That is, a boosting operation equivalent to that of the circuit of FIG. 3 of the first preferred embodiment can be realized by correspondingly enlarging the gate width of the transistor Q1 shown in FIG. 10.

Also, enlarging the gate width of the transistor Q1 enhances its driving capability, and as a result the rising and falling rates of the output signal $G_n$ become faster, which enhances the invention's effect of achieving higher-speed operation.

Sixth Preferred Embodiment

FIG. 11 is a circuit diagram illustrating the configuration of a unit shift register circuit SR according to a sixth preferred embodiment of the invention.

The output stage of the unit shift register circuit SR includes a transistor Q1 (a first transistor) connected between the output terminal OUT and the clock terminal CK, and a transistor Q2 (a second transistor) connected between the output terminal OUT and the first power-supply terminal s1. The node to which the gate (control electrode) of the transistor Q1 is connected is again defined as a node N1 (a first node) and the node to which the gate of the transistor Q2 is connected is defined as a node N2.

A capacitive element C1 is provided between the gate and source of the transistor Q1 (i.e., between the output terminal OUT and the node N1). Also, a transistor Q3 (a third transistor) is connected between the node N1 and the second power-supply terminal s2, and the gate of the transistor Q3 is connected to the first input terminal IN1. A transistor Q4 is connected between the node N1 and the first power-supply terminal s1, and the gate of the transistor Q4 is connected to the node N2.

The unit shift register circuit SR of this preferred embodiment includes a transistor Q13 and a capacitive element C4 that are connected in series between the node N1 and the second input terminal IN2. That is, the source of the transistor Q13 is connected to the node N1 and its drain is connected to one end of the capacitive element C4, and the other end of the capacitive element C4 is connected to the second input terminal IN2. The transistor Q13 has its gate and drain connected to each other, to form a so-called diode connection. That is, when the connection node between the capacitive element C4 and the transistor Q13 (i.e., the node of the gate and drain of the transistor Q13) is defined as a node N5 (a second node), the transistor Q13 functions as a unidirectional switching element that conducts in the direction from the node N5 to the node N1.

A transistor Q14 (a fourth transistor) is connected between the node N5 defined above and the second power-supply terminal s2, and its gate is connected to the first input terminal IN1. Also, a transistor Q15 is connected between the node N5 and the first power-supply terminal s1, and its gate is connected to the node N2.

A diode-connected transistor Q6 is connected between the node N2 and the third power-supply terminal s3, and a transistor Q7 is connected between the node N2 and the first power-supply terminal s1. The gate of the transistor Q7 is connected to the node N5.

The transistor Q7 has a sufficiently larger driving capability (the capability of passing current) than the transistor Q6, and the transistor Q6 and the transistor Q7 form a ratio-type inverter whose operation is defined by the ratio between their on-state resistance values. This inverter uses the node N5 as its input end and the node N2 as its output end, and it forms "a pull-down driving circuit" that drives the transistor Q2 to pull down the output terminal OUT.

As shown in FIG. 11, the unit shift register circuit SR of this preferred embodiment further includes a transistor Q16 connected between the node N2 and the first power-supply terminal s1 and having its gate connected to the output terminal OUT. This transistor Q16 does not affect the logical operation of the unit shift register circuit SR, and the transistor Q16 will be described in detail later.

The unit shift register circuits SR of this preferred embodiment, too, are cascade-connected as shown in FIG. 2 to form the gate line driving circuit 30. That is, in each unit shift register circuit SR, the clock terminal CK is supplied with a given one of the three-phase clock signals CLK1, CLK2 and CLK3, and the reset terminal RST is connected to the output terminal OUT of the next-stage unit shift register circuit SR.

In the first-stage unit shift register circuit SR1, the first and second input terminals IN1 and IN2 respectively receive first and second start pulses SP1 and SP2 as their input signals. In the second-stage unit shift register circuit SR2, the first input terminal IN1 receives the second start pulse SP2 and the second input terminal IN2 is connected to the output terminal OUT of the first-stage unit shift register circuit SR1. In each of the unit shift register circuits SR of the third and following stages, the first input terminal IN1 is connected to the output terminal OUT of the unit shift register circuit SR that is two stages previous thereto (the stage that precedes the immediately preceding stage), and the second input terminal IN2 is connected to the output terminal OUT of the immediately preceding unit shift register circuit SR. The output signals outputted to the output terminals OUT of the individual unit shift register circuits SR are outputted to the gate lines GL as horizontal (or vertical) scanning pulses.

Figure 12:
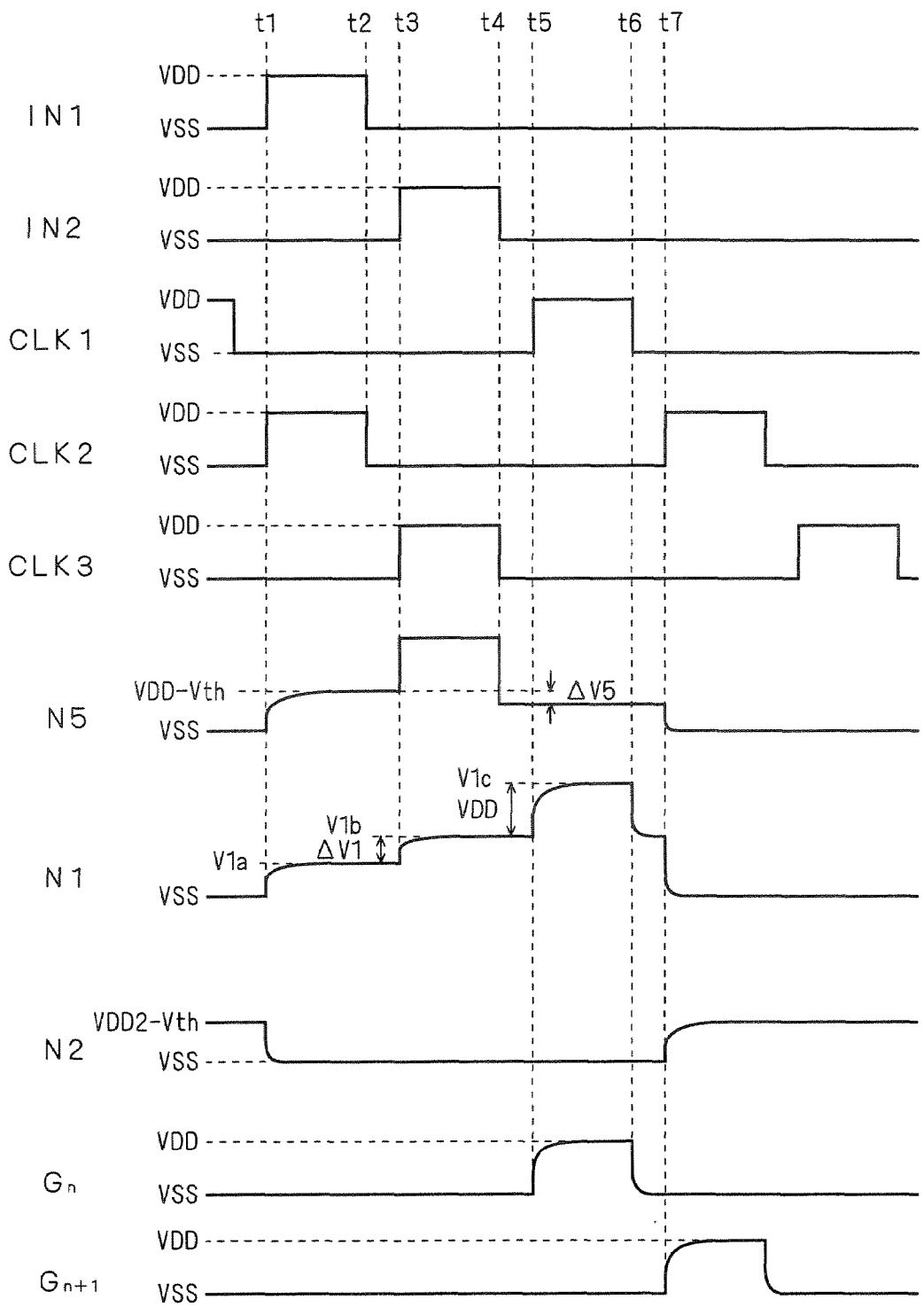
FIG. 12 is a timing chart illustrating the operation of the unit shift register circuit of the sixth preferred embodiment.

FIG. 12 is a timing chart illustrating the operation of the unit shift register circuits of the sixth preferred embodiment. The specific operation of the unit shift register circuits SR of this preferred embodiment will be described referring to FIG. 12, where, again, the operation of one unit shift register circuit SR will be described because the individual unit shift register circuits SR of the gate line driving circuit 30 operate substantially the same. For the sake of simplicity, the description assumes that the clock signal CLK1 is inputted to the clock terminal CK of the unit shift register circuit SR (for example, this corresponds to the unit shift register circuits SR1 and SR4 of FIG. 2).

Now, the gate line driving signal that is outputted from this unit shift register circuit SR is defined as $G_n$, the output signals of the unit shift register circuits SR that are one stage previous thereto, and two stages previous thereto, are defined respectively as $G_{n-1}$ and $G_{n-2}$, and the gate line driving signal outputted from the next-stage unit shift register circuit SR is defined as $G_{n+1}$. For the sake of simplicity of description, it is assumed that the H levels of the clock signals CLK1, CLK2, CLK3, and the first start pulse SP1 and the second start pulse SP2 are all equal, and this level is expressed as VDD. It is also assumed that this level VDD is equal to the level of the high power-supply potential VDD1 (i.e., VDD=VDD1).

First, in an initial state, suppose that the circuit is in a reset state in which the node N1 and the node N5 are at an L (Low) level (VSS), and the node N2 is at an H (High) level (VDD2−Vth (Vth: transistor's threshold voltage)). Also, suppose that the clock terminal CK (clock signal CLK1), the reset terminal RST (the output signal $G_{n+1}$ from the next stage), the first input terminal IN1 (the output signal $G_{n-2}$ of the two-stages-previous circuit), and the second input terminal IN2 (the output signal $G_{n-1}$ of the immediately preceding circuit) are all at an L level. In the reset state, the gate line connected to this unit shift register circuit SR is in an unselected state.

In this state, at time t1, the output signal $G_{n-2}$ of the two-stages-previous circuit (or the first start pulse SP1 in the case of the first-stage unit shift register circuit SR1) goes to the H level, and it is inputted to the first input terminal IN1 of this unit shift register circuit SR, and then the transistor Q3 and the transistor Q14 turn on. At this moment, the node N2 is at the H level, and so the transistors Q4 and Q15 are also on, but the nodes N1 and N5 are charged to raised levels respectively through the transistors Q3 and Q14, because the driving capabilities of the transistors Q3 and Q14 are sufficiently larger than the driving capabilities of the transistors Q4 and Q15, and the on-state resistances of the transistors Q3 and Q14 are sufficiently lower than the on-state resistances of the transistors Q4 and Q15. That is, the transistor Q3 functions as a charging circuit that charges the node N1 connected to the gate of the transistor Q1, on the basis of the signal inputted to the first input terminal IN1.

As the level at the node N5 rises, the transistor Q7 starts conducting, and the level at the node N2 falls. Then, the resistance of the transistor Q15 increases and the level at the node N5 rapidly rises. In response, the transistor Q7 sufficiently turns on. As a result, the node N2 goes to the L level (VSS), the transistors Q4 and Q15 turn off, and the nodes N1 and N5 go to an H level.

While raising the level at the node N5 requires charging the capacitive element C4 and the gate capacitance of the transistor Q13 connected thereto, the node N5 can be charged relatively rapidly because their capacitance values can be about ⅕ to 1/10 as compared with the values of the transistor Q1 and the capacitive element C1 of the output stage. Accordingly, the level at the node N5 can be rapidly raised, though the transistor Q14 operates in a source follower mode where high-speed charging is relatively difficult, and the node N5 is charged to VDD−Vth.

It is difficult to rapidly charge the node N1, because raising the level at the node N1 requires charging the capacitive element C1 and the gate capacitance of the transistor Q1 whose capacitance values are quite large as mentioned above. Also, it is difficult to raise the level at the node N1 to the logical value (VDD−Vth) in a short time, because the transistor Q3 operates in a source follower mode when charging the node N1. Accordingly, the level at the node N1 at this moment rises only to a certain level Va1 that is lower than the logical value, unless the output signal $G_{n-2}$ of the two-stages-previous circuit has a sufficiently large pulse width.

At time t2, the output signal $G_{n-2}$ from the two-stages-previous circuit goes back to the L level, and the transistors Q3 and Q14 turn off. After that, the levels are maintained because the node N1 and the node N5 enter a floating state and the transistors Q7 and Q15 work as a flip-flop.

Then, at time t3, the output signal $G_{n-1}$ of the preceding stage (or the second start pulse SP2 in the case of the first-stage unit shift register circuit SR1) goes to the H level, and the second input terminal IN2 of the unit shift register circuit SR goes to the H level. Then, the charged level at the node N5 is boosted by the capacitive coupling through the capacitive element C4.

The transistor Q13 serves as a diode that conducts in the direction from the node N5 to the node N1. Accordingly, when the node N5 is boosted, a charge flows from the node N5 to the node N1 through the transistor Q13, whereby the level at the node N1 is boosted.

More specifically, the charge at the node N5 is divided among the gate capacitance of the transistor Q1 and the capacitive elements C1 and C4, and so the amount of rise, $\Delta V1$, of the level at the node N1 is given as:

$$\Delta V1 = VDD \cdot C4/(C4+C1+CQ1) - Vth \qquad (3)$$

In Expression (3), C4 is the capacitance value of the capacitive element C4, C1 is the capacitance value of the capacitive element C1, CQ1 is the gate capacitance value of the transistor Q1, and Vth is the threshold voltage of the transistor Q13. In this way, the transistors Q13 and Q14 and the capacitive element C4 form a sort of charge pump circuit, which functions as a boosting circuit that performs a charge-pump operation to boost the node N1 that has been charged by the transistor Q3.

In the unit shift register circuit SR of FIG. 11, it is difficult to obtain a large value of the amount of rise $\Delta V1$, because the capacitance value (C1) of the capacitive element C1 and the gate capacitance value (QC1) of the transistor Q1 are relatively large, but it is easily achievable to obtain such a value as to bring the level at the node N1 to VDD1 or higher after boosted by the capacitive element C4. That is, when the level at the node N1 after boosted by the charge-pump operation is expressed as V1b, it is possible to achieve:

$$V1b = V1a + \Delta V1 \geq VDD1 \qquad (4).$$

With this operation, the unit shift register circuit SR enters a set state in which the node N1 and the node N5 are at the H levels and the node N2 is at the L level. In the set state, the transistor Q1 is on and the transistor Q2 is off.

In the conventional unit shift register circuit described earlier, the node N1 can be charged only to rise to VDD1−Vth, but this preferred embodiment is capable of charging the node N1 to a level higher by Vth or more, as shown by Expression (4), than the conventional one.

After that, at time t4, the output signal $G_{n-1}$ of the preceding stage changes from the H level to the L level, and then the second input terminal IN2 goes to the L level. Then, the level at the node N5 falls following it, but the level at the node N1 stays unchanged (the set state is maintained), because the transistor Q13 serves as a diode. Accordingly, the level at the node N5 is lowered by a voltage $\Delta V5$ that corresponds to the amount of charge passed from the node N5 to the node N1 by the charge-pump operation (see FIG. 12).

When the amount of reduction, $\Delta V5$, of the level at the node N5 is large, the resistance value of the transistor Q7 increases, and then the potential at the node N2, which is at the L level, might rise. Then, after that (at time t5), when the level at the output terminal OUT (the output signal $G_n$) rises and the level at the node N2 further rises due to the overlap capacitance between the gate and drain of the transistor Q2, the transistor Q2 will become conductive and the level of the output signal $G_n$ will be undesirably lowered. The transistor Q16 is provided to prevent this problem. That is, the transistor Q16 turns on when the output signal $G_n$ attains the H level, so as to fix the node N2 at the low power-supply potential VSS, in order to prevent the transistor Q2 from undesirably turning on. Needless to say, the transistor Q16 can be omitted when the amount of reduction ΔV5 of the level at the node N5 is so small that the problem does not occur.

In the unit shift register circuit SR being in the set state, the transistor Q1 is on and the transistor Q2 is off, and the level of the output signal $G_n$ at the output terminal OUT rises when the clock signal CLK1 at the clock terminal CK attains the H level at time t5. Then, the level at the node N1 is boosted by a particular voltage due to the capacitive coupling through the capacitive element C1 and the gate capacitance of the transistor Q1.

When it is assumed that the parasitic capacitance value of the node N1 is sufficiently smaller than the sum of the capacitance values of the gate capacitance of the transistor Q1 and the capacitive element C1, then the level V1c at the node N1 that has been boosted in response to the output signal $G_n$ is given as:

$$V1c = V1b + VDD \geq 2 \times VDD \quad (5)$$

As can be seen from Expression (5), after the node 1 has been boosted in response to the output signal $G_n$, the gate-source voltage of the transistor Q1 is still larger than that of the first preferred embodiment, and the level of the output terminal OUT, i.e., the output signal $G_n$, further quickly rises following the clock signal CLK1. Also, the transistor Q1 performs a non-saturated operation without involving the loss corresponding to the threshold voltage Vth, and so the H level of the output signal $G_n$ is VDD which is equal to the H level of the clock signal CLK1.

The output signal $G_n$ that attained the H level at time t5 maintains the H level and activates the gate line while the clock signal CLK1 is at the H level. Then, at time t6, the clock signal CLK1 goes back to the L level and then the gate line driving signal $G_n$ also goes to the L level, thus returning to the gate line unselecting state. At this time, the level at the node N1 also falls to the level that it exhibited before being boosted.

After that, at time 7 at which the clock signal CLK2 attains the H level, the gate line driving signal $G_{n+1}$ of the next stage attains the H level, which is inputted to the reset terminal RST to turn on the transistor Q5. Then, the level at the node N5 falls and the transistor Q7 turns off, and the node N2 goes to the H level. In response, the transistor Q4 turns on, to bring the node N1 to the L level. As a result, the circuit returns to the reset state where the transistor Q1 is off and the transistor Q2 is on.

The operations described so far can be summarized as follows. According to the preferred embodiment, while no signals are inputted to the first input terminal IN1 and the second input terminal IN2, the unit shift register circuit SR is in a reset state where the node N1 is at the L level (VSS) and the node N2 is at the H level (VDD2−Vth). In this period, the transistor Q1 is off and the transistor Q2 is on, and therefore the output terminal OUT is maintained at the low-impedance L level (VSS). Then, when the pulse signals are inputted to the first input terminal IN1 and the second input terminal IN2 in this order, the unit shift register circuit SR enters a set state where the node N2 is at the L level (VSS) and the node N1 is at the H level that is still higher than the high power-supply potential VDD1. In the set state, the transistor Q1 is on and the transistor Q2 is off, and the gate line output terminal OUT stays at the H level to activate the gate line, while the signal at the clock terminal CK (clock signal CLK1) is at the H level. After that, the signal (the gate line driving signal $G_{n+1}$ of the next stage) is inputted to the reset terminal RST, and then the unit shift register circuit RS returns to the reset state where the node N1 and the node N5 are at the L levels and the node N2 is at the H level.

When a plurality of unit shift register circuits SR, each operating as described above, are cascade-connected as shown in FIG. 2, the gate line driving circuit 30 operates as shown in the timing chart of FIG. 5 explained earlier.

As described so far, according to the unit shift register circuits SR of this preferred embodiment, the transistor Q3 as a charging circuit charges the gate of the transistor Q1 (the node N1), and next the boosting circuit (charge-pump circuit) including the transistors Q13 and Q14 and the capacitive element C4 boosts the charged node N1. Accordingly, even when the clock signal frequency is high and the pulse width of the signals inputted to the first and second input terminals IN1 and IN2 is narrow, it is possible to sufficiently pre-charge the node N1 to prevent the reduction of the driving capability of the transistor Q1. Also, the charge-pump operation by the boosting circuit allows the node N1 to be pre-charged to a higher level than in conventional techniques, and the driving capability of the transistor Q1 is higher than in conventional techniques. This allows higher-speed operation of the shift register circuit formed of the cascade-connected unit shift register circuits SR, and contributes to the achievement of higher resolution of the display apparatus that utilizes the gate line driving circuit formed of the shift register circuit.

Seventh Preferred Embodiment

Figure 13:
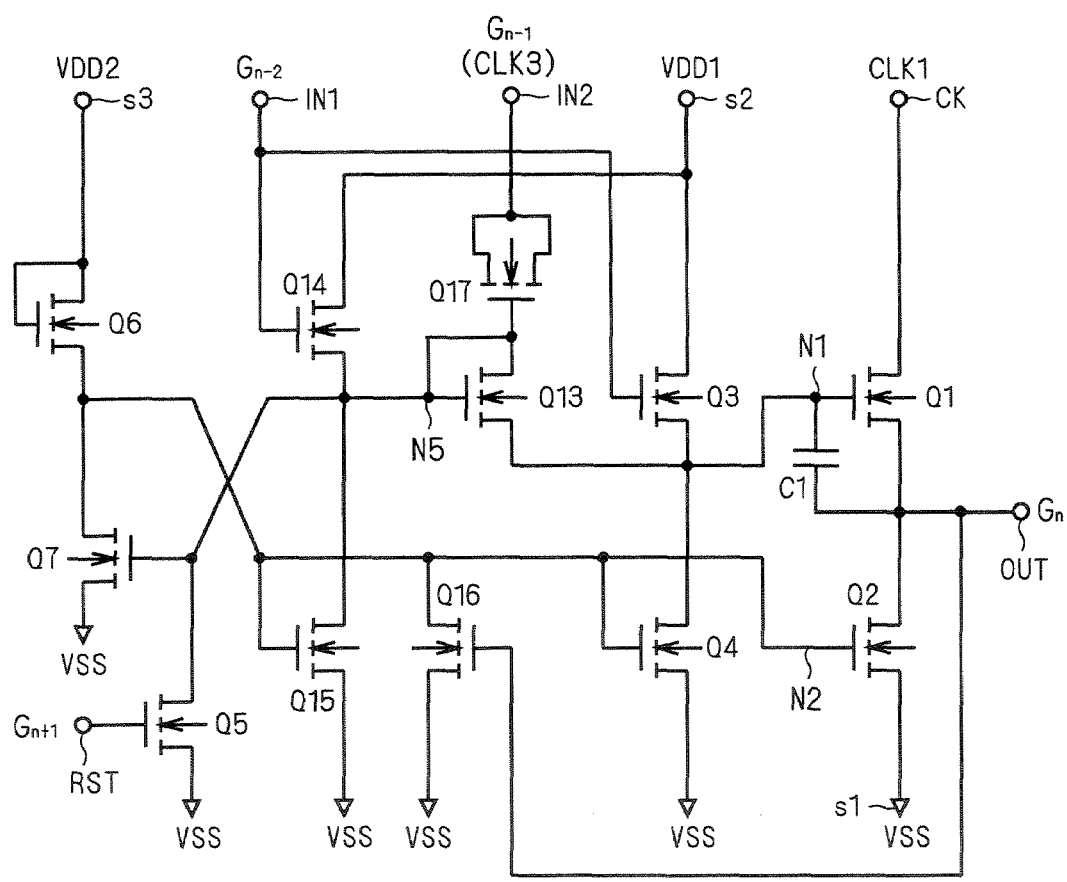
FIG. 13 is a circuit diagram illustrating the configuration of a unit shift register circuit according to a seventh preferred embodiment.

FIG. 13 is a circuit diagram illustrating the configuration of a unit shift register circuit SR according to a seventh preferred embodiment. As shown in FIG. 13, this preferred embodiment uses a transistor Q17 as an MOS capacitive element, as a capacitive element constituting a boosting circuit. That is, the transistor Q17 has its gate connected to the node N5 and its source and drain both connected to the second input terminal IN2.

The unit shift register circuit SR of this preferred embodiment operates in the same way as the unit shift register circuit SR of the sixth preferred embodiment, because the only difference in circuit configuration is that the capacitive element C4 of the sixth preferred embodiment is replaced by an MOS capacitive element (the gate capacitance of the transistor Q17). Accordingly, the same effects as those of the sixth preferred embodiment are obtained.

The transistor Q17 works as a capacitive element only when its gate and source are biased over the threshold voltage, i.e., only when the node N5 is charged at the H level. The transistor Q17, functioning as a capacitive element only when the node N5 is at the H level, causes no problems in operation, because the transistor Q17 is provided only to boost the charged node N5 such that the node N1 is supplied with charge.

In other words, the transistor Q17 does not function as a capacitive element while the node N5 is at the L level, and therefore the node N5 is not boosted in this period even when the second input terminal IN2 attains the H level. Accordingly, the signal input to the second input terminal IN2 is not limited to the output signal $G_{n-1}$ of the preceding stage, but the clock signal that is inputted to the preceding unit shift register circuit SR may be used. For example, when the clock signal CLK1 is inputted to the clock terminal CK of this unit shift register circuit SR as shown in FIG. 11, then the clock signal CLK3 may be inputted to its second input terminal IN2.

With the circuit configuration shown in FIG. 11 of the sixth preferred embodiment, if the clock signal CLK1 is inputted to the clock terminal CK and the clock signal CLK3 is inputted to the second input terminal IN2, for example, then the node N5 will be undesirably boosted by the clock signal CLK3 in reset states where the node N5 should be at the L level, which might cause malfunction. This preferred embodiment is free from this problem because the transistor Q17 does not function as a capacitive element when the node N5 is at the L level.

Furthermore, inputting a clock signal to the second input terminal IN2 allows the node N5 to be boosted more rapidly, because a clock signal usually rises more rapidly than the output signals of the unit shift register circuits SR. This further increases the rate of charging (pre-charging) of the node N1. In addition, this reduces the load imposed on the output terminal OUT of each unit shift register circuit SR, and suppresses the delay of the output signal $G_n$. Thus, inputting a clock signal to the second input terminal IN2 of the unit shift register circuit SR of this preferred embodiment makes the output signal still quicker than in the sixth preferred embodiment.

In the circuit shown in FIG. 13, both of the source and drain of the transistor Q17 are connected to the second input terminal IN2, but only one of them may be connected to the second input terminal IN2, because they both function as an electrode of the MOS capacitive element on the same side.

Eighth Preferred Embodiment

In the sixth and seventh preferred embodiments, too, the high power-supply potentials VDD1 and VDD2 may be at the same level. Accordingly, in this preferred embodiment, as in the fourth preferred embodiment, the second power-supply terminal s2 supplied with the high power-supply potential VDD1 and the third power-supply terminal s3 supplied with the high power-supply potential VDD2 are formed as a same terminal.

FIG. 14 is a circuit diagram of a unit shift register circuit SR of this preferred embodiment, where the second power-supply terminal s2 and the third power-supply terminal s3 of the unit shift register circuit SR of the sixth preferred embodiment (FIG. 11) are formed as a same terminal.

According to this preferred embodiment, the area required for the power-feeding interconnection is reduced, which contributes to higher integration of the gate line driving circuit, and further to the size-reduction of the display apparatus.

Ninth Preferred Embodiment

FIG. 15 is a circuit diagram illustrating the configuration of a unit shift register circuit SR according to a ninth preferred embodiment. In the sixth preferred embodiment, the capacitive element C1 for boosting the node N1 (a boosting capacitance) is provided between the gate and source of the transistor Q1, but it is replaced by the gate capacitance of the transistor Q1 in this preferred embodiment. In this case, the capacitive element C1 is not needed, as shown in the circuit diagram of FIG. 15.

Usually, the insulating film serving as the dielectric layer of a capacitive element formed in a semiconductor integrated circuit has the same thickness as the gate insulating film of transistors. Accordingly, when the capacitive element is replaced by the gate capacitance of a transistor, it can be replaced by a transistor having the same area as the capacitive element. That is, a boosting operation equivalent to that of the circuit of FIG. 11 of the sixth preferred embodiment can be realized by correspondingly enlarging the gate width of the transistor Q1 shown in FIG. 15.

Also, enlarging the gate width of the transistor Q1 enhances its driving capability, and as a result the rising and falling rates of the output signal $G_n$ become faster, which enhances the invention's effect of achieving higher-speed operation.

Tenth Preferred Embodiment

FIG. 16 is a circuit diagram illustrating the configuration of a unit shift register circuit according to a tenth preferred embodiment. In this preferred embodiment, as shown in FIG. 16, a voltage generating circuit 32 that supplies a given potential VDD4 to the drain of the transistor Q3 is connected to the unit shift register circuit SR of the first preferred embodiment (FIG. 3).

The voltage generating circuit 32 has a fourth power-supply terminal s4 that is supplied with a high power-supply potential VDD3, a voltage output terminal VT that outputs the potential VDD4, and at least one clock input terminal that receives a given clock signal as its input (FIG. 16 shows the clock signal CLK1 as a typical example). In this preferred embodiment, one of the multi-phase clock signals that drive the cascade-connected unit shift register circuits SR (i.e., the gate line driving circuit 30) is used as the clock signal inputted to the clock input terminal (FIG. 16 shows the clock signal CLK1 as a typical example).

The voltage generating circuit 32 generates the output potential VDD4 that is higher than the power-supply potential VDD3, on the basis of the potential VDD3 supplied to the fourth power-supply terminal s4 and the clock signal inputted to the clock input terminal. The potential VDD4 is higher than the amplitude of the clock signals (their H level potential), with respect to the low power-supply potential VSS.

FIG. 17 shows an example of a specific circuit configuration of the voltage generating circuit 32. The voltage generating circuit 32 uses a charge pump circuit CP in order to obtain the high potential output. The charge pump circuit CP includes transistors Q20 and Q21, and a capacitive element C5. The output end of the charge pump circuit CP, i.e., the voltage output terminal VT, is provided with a capacitive element C6.

In this preferred embodiment, the voltage generating circuit 32 (the charge pump circuit CP and the stabilizing capacitance C6) is formed on the same insulating substrate with the shift register circuit. Basically, a charge pump circuit is formed of at least two rectifier elements (diode elements) and at least one capacitive element. As the diode elements, this preferred embodiment uses the diode-connected transistors Q20 and Q21 that have the same structure as those used in the shift register circuit. Also, the capacitive element C5 having the same structure as the pixel capacitances (the capacitors 27 shown in FIG. 1) is used as the capacitive element. The capacitive element C6 is provided to stabilize the output of the charge pump circuit CP, and the capacitive element C6, too, has the same structure as the pixel capacitances. This allows the voltage generating circuit 32 to be fabricated in parallel with the fabrication of the shift register and pixel circuitry, without requiring an increased number of manufacturing process steps and at less manufacturing costs.

As shown in FIG. 17, the transistors Q20 and Q21 as diode elements (hereinafter, referred to respectively as "diode element Q20" and "diode element Q21") are connected in series between the fourth power-supply terminal s4 supplied with the high power-supply potential VDD3 and the voltage output terminal VT outputting the output potential VDD4. The diode elements Q20 and Q21 are both connected such that they have their anodes on the side of the fourth power-supply terminal s4 and their cathodes on the side of the voltage output terminal VT.

The capacitive element C5 is connected between the clock input terminal CK1 and the connection node between the diode elements Q20 and Q21 (hereinafter referred to as a node N6). The capacitive element C5 is provided to perform a charge-pump operation to repeatedly boost the node N6, and so an arbitrary clock signal can be inputted to the clock input terminal CK1. The clock signal may be any of the clock signals CLK1 to CLK3 that drive the unit shift register circuits SR. This avoids the necessity of separately providing a clock signal generating circuit for driving the charge pump circuit CP, thus avoiding increased circuit scale. In this preferred embodiment, it is assumed that the clock signal CLK1 is inputted to the clock input terminal CK1 of the circuit of FIG. 17. The capacitive element C5 is hereinafter referred to as "charge pump capacitance".

The capacitive element C6 is provided to stabilize the output potential VDD4 when a current flows from the voltage output terminal VT to the load (the node N1 of the unit shift register circuit SR), and the capacitive element C6 is connected between the voltage output terminal VT and the first power-supply terminal s1 that is supplied with the low power-supply potential VSS. The capacitive element C6 is hereinafter referred to as "stabilizing capacitance". It is not essential to connect one end of the stabilizing capacitance C6 to the first power-supply terminal s1, but it can be connected to any low-impedance node that is supplied with a constant voltage.

Now, the operation of the circuit of FIG. 17 is described. The threshold voltage of the transistors of the voltage generating circuit 32 is assumed to be Vth.

When the potential VDD3 is supplied to the fourth power-supply terminal s4, the diode element Q20 turns on and the potential at the node N6 attains VDD3−Vth. Also, the potential at the node N6 turns on the diode element Q21, and the potential at the voltage output terminal VT attains VDD3−2×Vth.

After that, the clock signal CLK1 (amplitude VDD) rises, and then the coupling through the charge pump capacitance C5 boosts the node N6. When the parasitic capacitance of the node N6 is ignored, the potential of the node N6 rises to VDD3−Vth+VDD. The potential rise at the node N6 causes the diode element Q21 to turn on, and a current flows from the node N6 to the voltage output terminal VT. This raises the level at the voltage output terminal VT by a certain amount, and on the other hand the level at the node N6 is lowered by the outflow of charge.

After that, the clock signal CLK1 falls, and the potential at the node N6 is pulled down by the coupling through the charge pump capacitance C5. When the node N6 was boosted as mentioned above, a charge flew out from the node N6 to the voltage output terminal VT. Accordingly, after the potential was pulled down, the level at the node N6 is lower than the level VDD3−Vth that it exhibited before being boosted (before the rise of the clock signal CLK1). However, the lowering of the potential at the node N6 causes the diode element Q20 to turn on, and so the node N6 is soon charged to return to VDD3−Vth.

Now, the potential at the node N6 is lower than that at the voltage output terminal VT, because the potential at the voltage output terminal VT was raised when the node N6 was boosted as mentioned above, but the potential at the voltage output terminal VT is maintained at the raised level because the diode element Q21 blocks current flow in the direction from the voltage output terminal VT to the node N6.

Subsequently, this operation is repeated at each input of the clock signal CLK1, and the potential VDD4 at the voltage output terminal VT finally attains VDD3−2×Vth+VDD.

Now, when it is assumed that the potentials VDD1 to VDD3 all have an equal value and that value is VDD and equal to the H level of the clock signals CLK1 to CLK3, the final output potential VDD4 of the voltage generating circuit 32 is 2×VDD−2×Vth, which is given as the drain potential of the transistor Q3. Under the same assumption, the drain potential of the transistor Q3 of the unit shift register circuit SR of the first preferred embodiment, for example, is VDD (=VDD2). That is, according to the unit shift register circuit SR of this preferred embodiment, the voltage generating circuit 32 supplies the drain of the transistor Q3 with the higher potential VDD4 (=2×VDD−2×Vth) even when the high power-supply potentials are the same potential VDD as the H level of the clock signals CLK1 to CLK3.

Accordingly, in this preferred embodiment, the transistor Q3 is capable of charging (pre-charging) the gate of the transistor Q1 (the node N1) to a higher potential than in the first preferred embodiment. This allows the transistor Q1 to exhibit a reduced on-state resistance when the output signal $G_n$ is outputted, which allows the output signal $G_n$ to rise and fall more quickly, thus allowing the shift register circuit to operate at higher speed. In other words, the rising and falling rates of the output signal $G_n$ are not lowered even when the channel width of the transistor Q1 is reduced, which allows a reduction of the area required for the shift register circuit.

The effects of this preferred embodiment are now described more specifically. The amplitude (H level potential) of the clock signals CLK1 to CLK3 is assumed to be VDD again. Then, in the circuit shown in FIG. 16, when the gate of the transistor Q3 (the node N3) is charged by the transistor Q8 in response to the two-stages-previous output signal $G_{n-2}$, the potential at the node N3 is determined by the H level potential of the output signal $G_{n-2}$. As described in the first preferred embodiment, when the amplitude of the clock signals CLK1 to CLK3 is VDD, the H level of the output signal of each unit shift register circuit SR is VDD, too.

The node N3 is charged by the transistor Q8 operating in a saturated region, and so the potential at the node N3 after charged involves a loss corresponding to the threshold voltage (Vth) of the transistor Q8, which is VDD−Vth. Accordingly, when the node N3 is boosted after that by the capacitive element C2 in response to the output signal $G_{n-1}$ (amplitude VDD) of the preceding stage, the potential at the node N3 is 2×VDD−Vth (where the parasitic capacitance of the node N3 is ignored).

Accordingly, when the drain potential of the transistor Q3 (i.e., the output potential VDD4 of the voltage generating circuit 32) at this time is 2×VDD−2×Vth or more, then the transistor Q3 is capable of charging (pre-charging) the node N1 to 2×VDD−2×Vth. As mentioned above, the output potential VDD4 of the voltage generating circuit 32 is expressed as VDD3−2×Vth+VDD, and so the condition is satisfied when the power-supply potential VDD3 supplied to the voltage generating circuit 32 is VDD or more. In this case, the gate-source voltage of the transistor Q1 is 2×VDD−2×Vth. After that, when the output signal $G_n$ is outputted, the on-state resistance of the transistor Q1 is determined by the gate-source voltage of the transistor Q1 of that time.

Usually, high power-supply potentials supplied to a shift register are set equal to the H level potential of clock signals. For instance, in the conventional circuit shown in FIG. 7 of Patent Document 1, when the high power-supply potential (VON) and the H level potential of the clock signal are both VDD, the node N1 exhibits a potential VDD−Vth when charged. Since the on-state resistance of the transistor Q1 (which corresponds to the transistor M1 of Patent Document 1) is proportional to its gate-source voltage, the value of the on-state resistance of the transistor Q1 of this preferred embodiment is halved as compared with that of the conventional example, which is expressed as (VDD−Vth)/(2×VDD−2×Vth)=½ times.

In the circuit of FIG. 16, the drain of the transistor Q8 is supplied with the constant potential VDD1, but it may be connected to the first input terminal IN1 together with its gate. That is, the transistor Q8 may be diode-connected between the first input terminal IN1 and the node N3. This applies also to the preferred embodiments described below. In this case, the two-stages-previous output signal $G_{n-2}$ inputted to the first input terminal IN1 functions also as a power supply for charging the node N3, and therefore the second power-supply terminal s2 and the power supply that supplies the potential VDD1 thereto can be omitted, which contributes to size-reduction of the circuit.

Also, this preferred embodiment has shown an example in which the voltage generating circuit 32 (the charge pump circuit CP and the stabilizing capacitance C6) are formed in the same substrate with the shift register circuit, but all or part of its components may be formed externally to the substrate and connected thereto. This reduces the required area of the substrate, but the number of terminals is increased because it requires formation of an external connection terminal(s) on the substrate to connect the circuitry in the substrate and the voltage generating circuit 32 (or part of it).

For example, the diode elements of the charge pump circuit CP of the voltage generating circuit 32 may be formed in the same substrate with the shift register circuit, with the capacitive elements (the charge pump capacitance and the stabilizing capacitance) formed as external components. This makes it possible to simplify the manufacturing process by fabricating the diode elements as transistors having the same structure as those of the shift register circuit, and also facilitates provision of capacitive elements with larger capacitances. Also, the parasitic capacitance of the circuit can be reduced by forming the diode elements and the stabilizing capacitance as external components and the charge pump capacitance within the substrate.

Eleventh Preferred Embodiment

The voltage generating circuit 32 shown in FIG. 17 supplies charge to the voltage output terminal VT through the charge pump capacitance C5 when the clock signal CLK1 rises, but the supply of charge to the voltage output terminal VT disappears when the clock signal CLK1 falls. Accordingly, while the clock signal CLK1 is at the L level, the voltage generating circuit 32 supplies current to the load (the node N1 of the unit shift register circuit SR) with the charge accumulated in the voltage stabilizing capacitance C6. That is, while the clock signal CLK1 is at the L level, the charge of the stabilizing capacitance C6 is only discharged, and the potential at the voltage output terminal VT (potential VDD4) is therefore lowered.

FIG. 18 is a circuit diagram illustrating the configuration of a voltage generating circuit 32 according to an eleventh preferred embodiment. This voltage generating circuit 32 includes parallel-connected, three charge pump circuits CP1 to CP3.

The charge pump circuit CP1 includes diode-connected transistors (diode elements) Q20a and Q21a, and a charge pump capacitance C5a connected between a clock input terminal CK1a and a node N6a between the diode elements Q20a and Q21a. In the same way, the charge pump circuit CP2 includes diode elements Q20b and Q21b, and a charge pump capacitance C5b connected between a clock input terminal CK1b and a node N6b between the diode elements Q20b and Q21b. Also, the charge pump circuit CP3 includes diode elements Q20c and Q21c, and a charge pump capacitance C5c connected between a clock input terminal CK1c and a node N6c between the diode elements Q20c and Q21c. That is, each of the charge pump circuits CP1 to CP3 shown in FIG. 18 has the same configuration as the charge pump circuit CP shown in FIG. 17.

The respective clock input terminals CK1a to CK1c of the charge pump circuits CP1 to CP3 receive clock signals having different phases. In this preferred embodiment, the clock signals CLK1 to CLK3 that drive the shift register circuit (the gate line driving circuit 30) are used as the clock signals. That is, as shown in FIG. 18, the clock signal CLK1 is inputted to the clock input terminal CK1a, the clock signal CLK2 is inputted to the clock input terminal CK1b, and the clock signal CLK3 is inputted to the clock input terminal CK1c.

Thus, in the voltage generating circuit 32 shown in FIG. 18, the voltage output terminal VT is supplied with charge from the charge pump circuit CP1 when the clock signal CLK1 rises, supplied with charge from the charge pump circuit CP2 when the clock signal CLK2 rises, and supplied with charge from the charge pump circuit CP3 when the clock signal CLK3 rises. That is, the voltage output terminal VT is supplied with charge sequentially by the clock signals CLK1 to CLK3, which solves the problem of potential reduction at the voltage output terminal VT.

This preferred embodiment has shown an example in which the voltage generating circuit 32 is formed of three charge pump circuits, but the voltage generating circuit 32 may be formed of a single charge pump circuit (i.e., like that of the tenth preferred embodiment), or two charge pump circuits, when the reduction of level at the voltage output terminal VT is permissible to some extent. For example, even when two charge pump circuits are provided, the voltage output terminal VT is supplied with charge two times more frequently than that of the tenth preferred embodiment, which suppresses the reduction of potential at the voltage output terminal VT.

Twelfth Preferred Embodiment

A twelfth preferred embodiment suggests a voltage generating circuit 32 that provides a higher output potential VDD4 than that of the tenth preferred embodiment.

Figure 19:
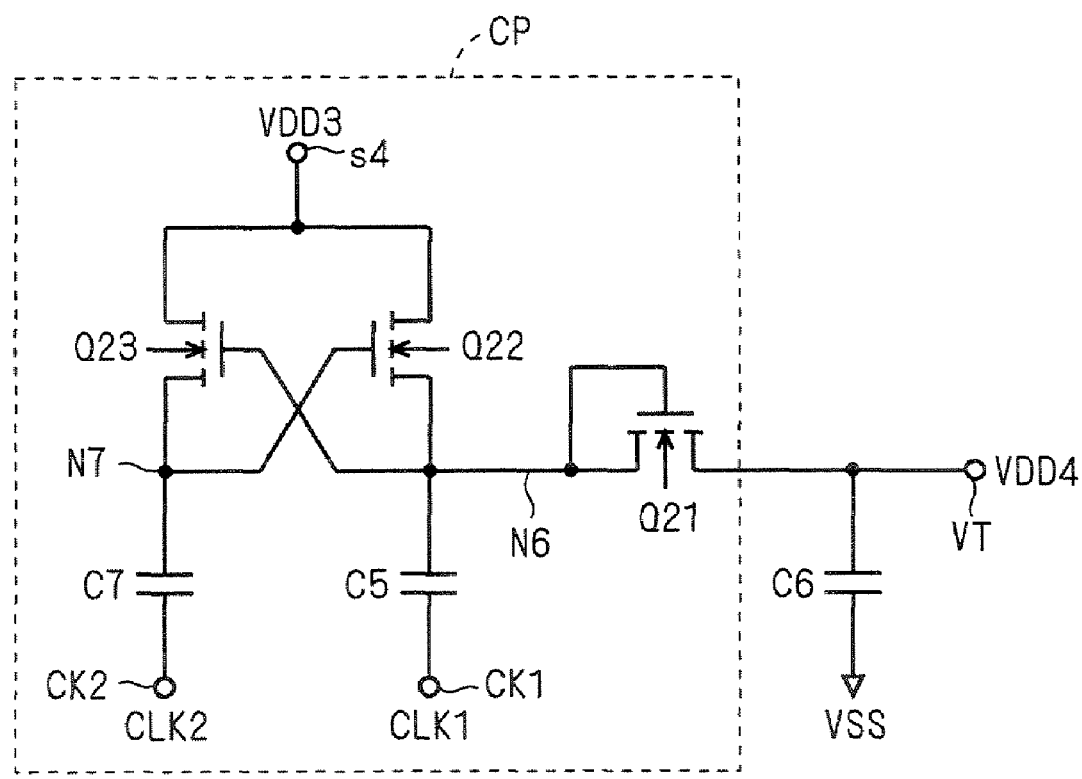
FIG. 19 is a circuit diagram illustrating the configuration of a voltage generating circuit according to a twelfth preferred embodiment.

FIG. 19 is a circuit diagram illustrating the configuration of the voltage generating circuit 32 of the twelfth preferred embodiment. In this preferred embodiment, too, the voltage generating circuit 32 is formed of a charge pump circuit CP and the stabilizing capacitance C6, but the charge pump circuit CP has a configuration different from that shown in FIG. 17.

As shown in FIG. 19, the charge pump circuit CP of this preferred embodiment includes a circuit formed of transistors Q22 and Q23 and a capacitive element C7, in place of the transistor Q20 shown in FIG. 17.

The transistor Q22 is connected between a fourth power-supply terminal s4 and a node N6 that corresponds to the anode of the diode element Q21. The transistor Q23 is connected between the fourth power-supply terminal s4 and the gate node of the transistor Q22 (a node N7), and its gate is connected to the node N6. The capacitive element C7 is connected between the node N7 and a clock input terminal CK2.

The clock input terminals CK1 and CK2 respectively receive clock signals having different phases (whose L-level active periods do not overlap) as their inputs. Such clock signals can be two of the clock signals CLK1 to CLK3 that drive the shift register circuit (the gate line driving circuit 30). In this preferred embodiment, as shown in FIG. 19, it is assumed that the clock signal CLK1 is inputted to the clock input terminal CK1, and the clock signal CLK2 is inputted to the clock input terminal CK2.

Next, the operation of the charge pump circuit CP of the voltage generating circuit 32 of this preferred embodiment will be described. Again, the amplitude of the clock signals CLK1 to CLK3 is assumed to be VDD, and the threshold voltage of the transistors of the voltage generating circuit 32 is assumed to be Vth.

As described in the tenth preferred embodiment, the node N6 of the circuit of FIG. 17 is charged to VDD3−Vth by the transistor Q20, but the node N6 of the charge pump circuit CP of FIG. 19 is charged to VDD3 by the circuit formed of the transistors Q22 and Q23 and the capacitive element C7. This is because the gate node of the transistor Q22 (the node N7) is boosted when the clock signal CLK2 rises, and the transistor Q22 then charges the node N6 through a non-saturated operation.

Accordingly, in the charge pump circuit CP of this preferred embodiment, when the clock signal CLK1 rises and the node N6 is boosted, the potential at the node N6 rises to as high as VDD3+VDD. This potential rise at the node N6 causes the diode element Q21 to turn on, and current flows from the node N6 to the voltage output terminal VT. Thus, the level at the voltage output terminal VT rises by a certain amount, and on the other hand the level at the node N6 falls in correspondence with the outflow of charge.

The node N7 is charged to the same level, VDD3, as the fourth power-supply terminal s4, because the transistor Q23 performs a non-saturated operation when the node N6 is boosted. At this time, from the relation between potentials, since the node N6 is boosted, the electrode of the transistor Q22 that is on the side of the fourth power-supply terminal s4 serves as the source, and the electrode on the side of the node N6 serves as the drain, but no current flows from the node N6 to the fourth power-supply terminal s4 because the potentials at the gate (the node N7) and the source (the fourth power-supply terminal s4) are equal. That is, the transistor Q22 functions as a rectifier element that charges the node N6 from the fourth power-supply terminal s4, but blocks current flow in the opposite direction.

Also, since the potential at the voltage output terminal VT is raised when the node N6 is boosted, the potential at the node N6 is lower than that at the voltage output terminal VT. However, the potential at the voltage output terminal VT is kept at the raised level because the diode element Q21 blocks current flow in the direction from the voltage output terminal VT to the node N6.

After that, when the clock signal CLK1 falls, the potential at the node N6 is pulled down by the coupling through the charge pump capacitance C5. At this time, the level at the node N6 becomes lower than VDD3 that it exhibited before being boosted (before the rise of the clock signal CLK1). However, when the clock signal CLK2 rises next, the transistor Q22 performs a non-saturated operation again to charge the node N6, and the level at the node N6 returns to VDD3.

Subsequently, this operation is repeated every time the clock signals CLK1 and CLK2 are inputted, and the potential VDD4 at the voltage output terminal VT finally attains VDD3−Vth+VDD. Then, when all of the potentials VDD1 to VDD3 are assumed to be equal and that value is assumed to be VDD equal to the H level of the clock signals CLK1 to CLK3, the final output potential VDD4 of the voltage generating circuit 32 is 2×VDD−Vth.

In this way, in the charge pump circuit CP of this preferred embodiment, the transistor Q22 charges the node N6 through non-saturated operation, and so the node N6 is charged to a level that is higher by the transistor threshold voltage Vth than in the tenth preferred embodiment. Correspondingly, the level of the node N6, when boosted by the clock signal CLK1, is also higher by Vth, and as a result the final potential at the voltage output terminal VT is also higher by Vth than that of the tenth preferred embodiment.

This preferred embodiment has shown an example in which the clock signals CLK1 and CLK2 are inputted respectively to the clock input terminals CK1 and CK2 of the voltage generating circuit 32, but, as mentioned earlier, any clock signals having different phases (whose active periods do not overlap) can be inputted to the clock input terminals CK1 and CK2. Accordingly, the clock signals CLK1 and CLK3 may be used in combination, or the clock signals CLK2 and CLK3 may be used in combination.

Also, in the charge pump circuit CP shown in FIG. 19, the capacitance value of the capacitive element C7 can be set smaller than that of the charge pump capacitance C5, because the capacitive element C7 is provided only to boost the gate of the transistor Q22. Similarly, the on-state resistance of the transistor Q23 can be higher than that of the transistor Q22, because the transistor Q23 is provided only to charge the gate of the transistor Q22.

Thirteenth Preferred Embodiment

Figure 20:
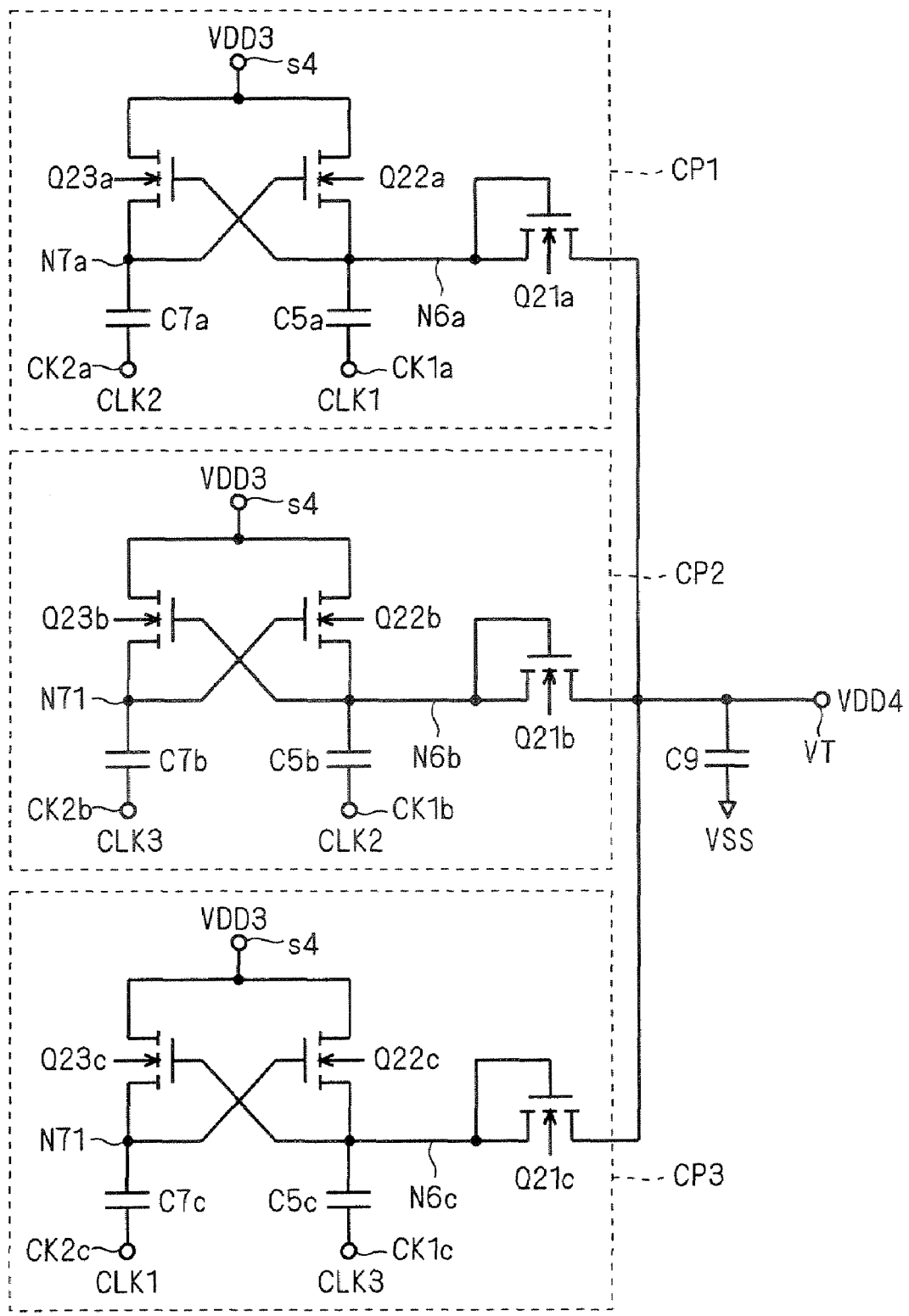
FIG. 20 is a circuit diagram illustrating the configuration of a voltage generating circuit according to a thirteenth preferred embodiment.

FIG. 20 is a circuit diagram illustrating the configuration of a voltage generating circuit 32 according to a thirteenth preferred embodiment. This voltage generating circuit 32, like that of the eleventh preferred embodiment, has parallel-connected, three charge pump circuits CP1 to CP3. However, in this preferred embodiment, the charge pump circuits CP1 to CP3 are each configured the same as the charge pump circuit CP shown in FIG. 19.

The respective clock input terminals CK1a to CK1c of the charge pump circuits CP1 to CP3 (which correspond to the clock input terminal CK1 shown in FIG. 19) receive clock signals having different phases. In this preferred embodiment, the clock signals CLK1 to CLK3 that drive the shift register circuit (the gate line driving circuit 30) are used as the clock signals. That is, as shown in FIG. 20, the clock signal CLK1 is inputted to the clock input terminal CK1a of the charge pump circuit CP1, the clock signal CLK2 is inputted to the clock input terminal CK1b of the charge pump circuit CP2, and the clock signal CLK3 is inputted to the clock input terminal CK1c of the charge pump circuit CP3.

The clock input terminal CK2a of the charge pump circuit CP1 receives the clock signal CLK2 having a different phase from the clock signal CLK1 inputted to its clock input terminal CK1a. Similarly, the clock input terminal CK2b of the charge pump circuit CP2 receives the clock signal CLK3 having a different phase from the clock signal CLK2 inputted to its clock input terminal CK1b. The clock input terminal CK2c of the charge pump circuit CP3 receives the clock signal CLK1 having a different phase from the clock signal CLK3 inputted to its clock input terminal CK1c.

Thus, in the voltage generating circuit 32 shown in FIG. 20, the voltage output terminal VT is supplied with charge from the charge pump circuit CP1 when the clock signal CLK1 rises, supplied with charge from the charge pump circuit CP2 when the clock signal CLK2 rises, and supplied with charge from the charge pump circuit CP3 when the clock signal CLK3 rises. That is, the voltage output terminal VT is almost always supplied with charge by the clock signals CLK1 to CLK3, which solves the problem of potential reduction at the voltage output terminal VT.

In this preferred embodiment, too, the voltage generating circuit 32 may be formed of a single charge pump circuit (i.e., like that of the twelfth preferred embodiment), or two charge pump circuits, when the reduction of level at the voltage output terminal VT is permissible to some extent.

Fourteenth Preferred Embodiment

Figure 21:
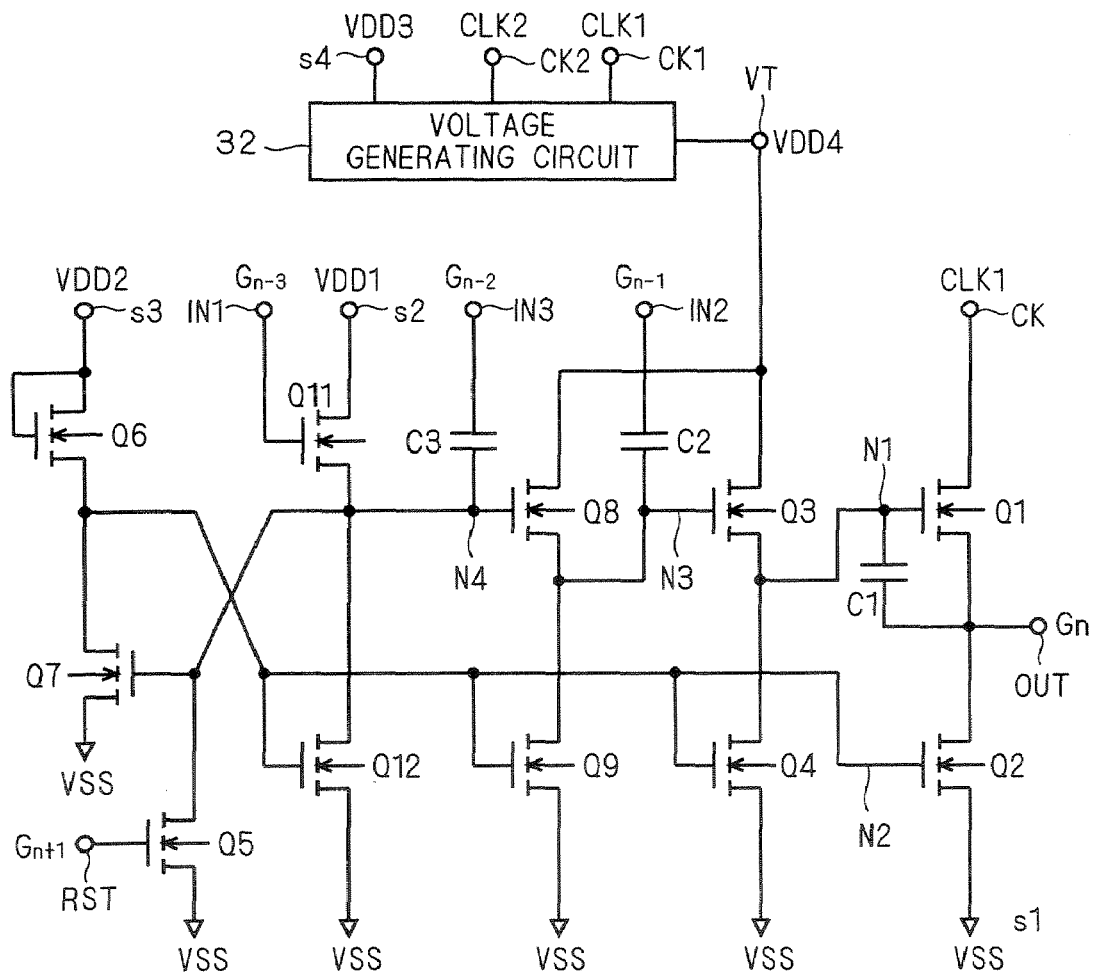
FIG. 21 is a circuit diagram illustrating the configuration of a unit shift register circuit according to a fourteenth preferred embodiment.

FIG. 21 is a circuit diagram illustrating the configuration of a unit shift register circuit according to a fourteenth preferred embodiment. As shown in FIG. 21, in the unit shift register circuit SR of this preferred embodiment, a voltage generating circuit 32 that supplies a given potential VDD4 to the drain of the transistor Q3 is connected to the unit shift register circuit SR of the third preferred embodiment (FIG. 7) that is driven by the four-phase clock signals CLK1 to CLK4.

The voltage generating circuit 32 generates the potential VDD4 that is higher than the potential VDD3, on the basis of the potential VDD3 supplied to its fourth power-supply terminal s4 and the clock signals inputted to its clock input terminals. The potential VDD4 is higher also than the H level potential of the clock signals and other high power-supply potentials VDD1 and VDD2 supplied to the unit shift register circuit SR.

Figure 22:
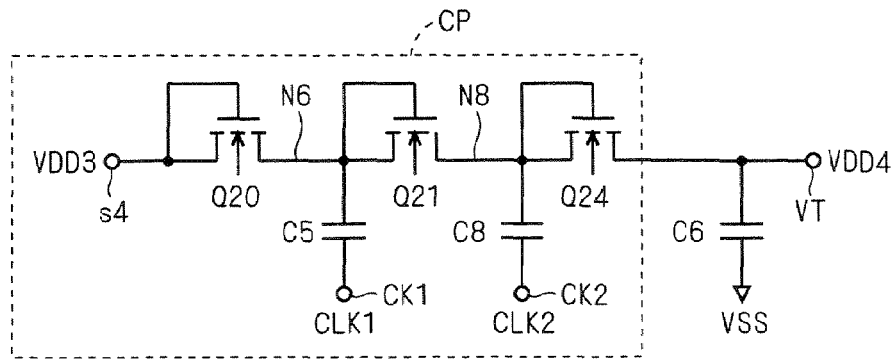
FIG. 22 is a circuit diagram illustrating the configuration of a voltage generating circuit of the fourteenth preferred embodiment.

FIG. 22 shows an example of a specific circuit configuration of the voltage generating circuit 32 of this preferred embodiment. Like that shown in FIG. 17, this voltage generating circuit 32 is formed of a charge pump circuit CP and the stabilizing capacitance C6, but the configuration of the charge pump circuit CP differs from that shown in FIG. 17. That is, the charge pump circuit CP of this preferred embodiment differs from the charge pump circuit CP of FIG. 17 in that a diode-connected transistor Q24 (a diode element) is further connected between the diode element Q21 and the voltage output terminal VT, and a capacitive element C8 (a charge pump capacitance) is further connected between the clock input terminal CK2 and a node N8 between the diode elements Q21 and Q24.

The clock input terminals CK1 and CK2 respectively receive clock signals having different phases (whose H-level active periods do not overlap). Two of the clock signals CLK1 to CLK4 that drive the shift register circuit (gate line driving circuit 30) can be used as the clock signals. In this preferred embodiment, as shown in FIG. 22, the clock signal CLK1 is inputted to the clock input terminal CK1, and the clock signal CLK2 is inputted to the clock input terminal CK2.

It is assumed that the high power-supply potentials VDD1 to VDD3 are equal to the H level of the clock signals CLK1 to CLK4. Then, because the circuit configuration formed of the diode elements Q20, Q21 and the charge pump capacitance C5 is the same as that of FIG. 17, the potential at the node N8 is raised to 2×VDD−2×Vth by the charge pump operation. In the circuit of FIG. 22, the charge pump capacitance C8 and the diode element Q24 further perform a charge pump operation, so that the potential at the voltage output terminal VT (VDD4) can be raised to a potential (3×VDD−3×Vth) which is still higher by VDD−Vth than that at the node N8.

That is, the charge pump circuit CP of the voltage generating circuit 32 of this preferred embodiment includes two stages of champ pump circuits, and it is possible to charge the node N1 of the unit shift register circuit SR to a potential that is three times higher than the conventional one (FIG. 7 of Patent Document 1). It is therefore possible to triple the gate-source voltage of the transistor Q1 when the unit shift register circuit SR outputs the output signal $G_n$. In other words, the on-state resistance at that moment can be one-third, which allows the output signal $G_n$ to rise/fall further quickly.

According to the present invention, as can be seen from the tenth and fourteenth preferred embodiments, with a shift register circuit using three-phase clock signals as shown in FIG. 16, the voltage generating circuit 32 is formed of a single-stage charge pump circuit, as shown in FIG. 17, including two diode elements and one charge pump capacitance, and the gate-source voltage of the transistor Q1 can be doubled as compared with that of the conventional technique. Also, with a shift register circuit using four-phase clock signals as shown in FIG. 21, the voltage generating circuit 32 is formed of a two-stage charge pump circuit, as shown in FIG. 22, including three diode elements and two charge pump capacitances, and the gate-source voltage of the transistor Q1 can be tripled as compared with that of the conventional technique. That is, with a shift register circuit using n-phase clock signals, the voltage generating circuit 32 is formed of an (n−2)-stage charge pump circuit including series-connected n−1 diode elements and n−2 charge pump capacitance(s) connected respectively to n−2 connection node(s) therebetween, and it is possible to make the gate-source voltage of the transistor Q1 n−1 times. However, it should be noted that the voltage has to be set within the transistors' breakdown voltages.

Fifteenth Preferred Embodiment

This preferred embodiment describes a technique for preventing the reduction of the potential (VDD4) at the voltage output terminal VT with a shift register circuit driven by four-phase clock signals CLK1 to CLK4 as shown in the fourteenth preferred embodiment.

Figure 23:
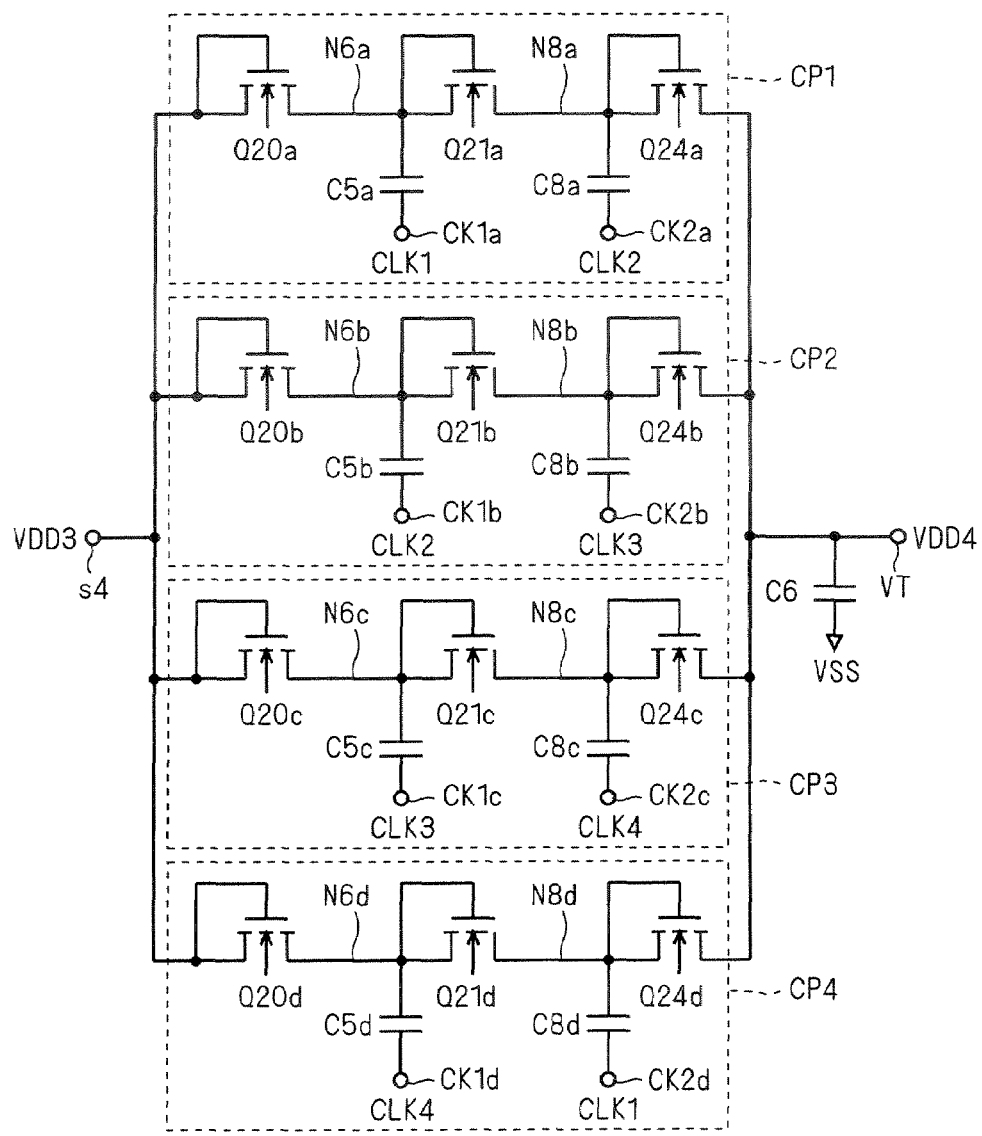
FIG. 23 is a circuit diagram illustrating the configuration of a voltage generating circuit according to a fifteenth preferred embodiment.

FIG. 23 is a circuit diagram illustrating the configuration of a voltage generating circuit 32 according to a fifteenth preferred embodiment. The eleventh preferred embodiment is applied to the voltage generating circuit 32, and the voltage generating circuit 32 includes four charge pump circuits CP1 to CP4 connected in parallel. In this preferred embodiment, each of the charge pump circuits CP1 to CP4 has the same configuration as the charge pump circuit CP shown in FIG. 22.

The respective clock input terminals CK2a to CK2d of the charge pump circuits CP1 to CP4 (which correspond to the clock input terminal CK2 shown in FIG. 22) each receive one of the clock signals CLK1 to CLK4 that drive the shift register circuit (the gate line driving circuit 30). That is, as shown in FIG. 23, the clock signal CLK2 is inputted to the clock input terminal CK2a of the charge pump circuit CP1, the clock signal CLK3 is inputted to the clock input terminal CK2b of the charge pump circuit CP2, the clock signal CLK4 is inputted to the clock input terminal CK2c of the charge pump circuit CP3, and the clock signal CLK1 is inputted to the clock input terminal CK2d of the charge pump circuit CP4.

The clock input terminal CK1a of the charge pump circuit CP1 receives the clock signal CLK1 having a different phase from the clock signal CLK2 inputted to its clock input terminal CK2a. The clock input terminal CK1b of the charge pump circuit CP2 receives the clock signal CLK2 having a different phase from the clock signal CLK3 inputted to its clock input terminal CK2b. The clock input terminal CK1c of the charge pump circuit CP3 receives the clock signal CLK3 having a different phase from the clock signal CLK4 inputted to its clock input terminal CK2c. The clock input terminal CK1d of the charge pump circuit CP4 receives the clock signal CLK4 having a different phase from the clock signal CLK1 inputted to its clock input terminal CK2d.

Thus, in the voltage generating circuit 32 shown in FIG. 23, the voltage output terminal VT is supplied with charge from the charge pump circuit CP4 when the clock signal CLK1 rises, supplied with charge from the charge pump circuit CP1 when the clock signal CLK2 rises, supplied with charge from the charge pump circuit CP2 when the clock signal CLK3 rises, and supplied with charge from the charge pump circuit CP3 when the clock signal CLK4 rises. That is, the voltage output terminal VT is supplied with charge sequentially by the clock signals CLK1 to CLK4, which solves the problem of potential reduction at the voltage output terminal VT.

Sixteenth Preferred Embodiment

This preferred embodiment also describes a technique for preventing the reduction of the potential (VDD4) at the voltage output terminal VT with a shift register circuit driven by four-phase clock signals CLK1 to CLK4 as shown in the fourteenth preferred embodiment.

FIG. 24 is a circuit diagram illustrating the configuration of a voltage generating circuit 32 according to a sixteenth preferred embodiment. Like that of the fifteenth preferred embodiment, this voltage generating circuit 32 includes four charge pump circuits CP1 to CP4 connected in parallel. In this preferred embodiment, each of the charge pump circuits CP1 to CP4 has the same configuration as the charge pump circuit CP shown in FIG. 19.

The respective clock input terminals CK1a to CK1d of the charge pump circuits CP1 to CP4 (which correspond to the clock input terminal CK1 shown in FIG. 19) each receive one of the clock signals CLK1 to CLK4 that drive the shift register circuit (the gate line driving circuit 30). That is, as shown in FIG. 24, the clock signal CLK1 is inputted to the clock input terminal CK1a of the charge pump circuit CP1, the clock signal CLK2 is inputted to the clock input terminal CK1b of the charge pump circuit CP2, the clock signal CLK3 is inputted to the clock input terminal CK1c of the charge pump circuit CP3, and the clock signal CLK4 is inputted to the clock input terminal CK1d of the charge pump circuit CP4.

The clock input terminal CK2a of the charge pump circuit CP1 receives the clock signal CLK4 having a different phase from the clock signal CLK1 inputted to its clock input terminal CK1a. The clock input terminal CK2b of the charge pump circuit CP2 receives the clock signal CLK3 having a different phase from the clock signal CLK2 inputted to its clock input terminal CK1b. The clock input terminal CK2c of the charge pump circuit CP3 receives the clock signal CLK2 having a different phase from the clock signal CLK3 inputted to its clock input terminal CK1c. The clock input terminal CK2d of the charge pump circuit CP4 receives the clock signal CLK1 having a different phase from the clock signal CLK4 inputted to its clock input terminal CK1d.

Thus, in the voltage generating circuit 32 shown in FIG. 24, the voltage output terminal VT is supplied with charge from the charge pump circuit CP1 when the clock signal CLK1 rises, supplied with charge from the charge pump circuit CP2 when the clock signal CLK2 rises, supplied with charge from the charge pump circuit CP3 when the clock signal CLK3 rises, and supplied with charge from the charge pump circuit CP4 when the clock signal CLK4 rises. That is, the voltage output terminal VT is supplied with charge sequentially by the clock signals CLK1 to CLK4, which solves the problem of potential reduction at the voltage output terminal VT.

The tenth to sixteenth preferred embodiments described above have shown configurations (FIGS. 16 and 21) in which a voltage generating circuit 32 is connected to the unit shift register circuits SR of the first and third preferred embodiments (FIGS. 3 and 7), but the application of the voltage generating circuit 32 is not limited thereto. The voltage generating circuit 32 is applicable also to the unit shift register circuits SR of the second, fourth and fifth preferred embodiments (FIGS. 6, 9 and 10) that include a boosting circuit that boosts the gate of the transistor Q3 (the node N3) that has been charged. In this case, as in the tenth to sixteenth preferred embodiments, the effect of enabling the gate of the transistor Q1 (the node N1) to be charged to higher potential is obtained.

Seventeenth Preferred Embodiment

A seventeenth preferred embodiment shows modifications of the unit shift register circuits SR of the preferred embodiments.

Figure 25:
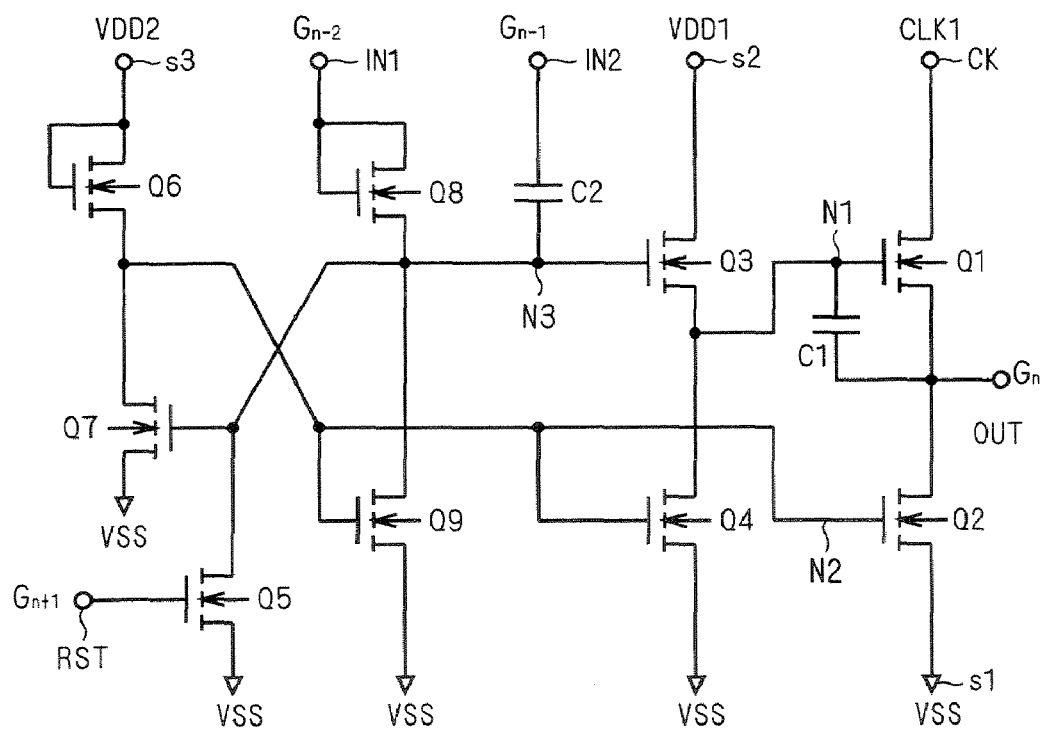
FIG. 25 is a circuit diagram illustrating the configuration of a unit shift register circuit according to a seventeenth preferred embodiment.

For example, in the unit shift register circuit SR of FIG. 3, the drain of the transistor Q8 that charges the node N3 is connected to the second power-supply terminal s2 that is supplied with a constant power-supply potential (the high power-supply potential VDD1), but it may be connected to the first input terminal IN1 as shown in FIG. 25. Then, the charge used to charge the node N3 is supplied by the output signal $G_{n-2}$ of the circuit that is two stages previous thereto, but this configuration operates the same as that shown in FIG. 3, and offers the same effects as those of the first preferred embodiment. Though not shown graphically, the drain of the transistor Q8 may be connected to the first input terminal IN1 also in the configurations shown in FIGS. 6, 10 and 16.

Also, for example, in the unit shift register circuit SR of FIG. 7, the drain of the transistor Q11 that charges the node N4 may be connected to the first input terminal IN1 as shown in FIG. 26. Then, the charge used to charge the node N4 is supplied by the output signal $G_{n-3}$ of the circuit that is three stages previous thereto, but this configuration operates the same as the circuit shown in FIG. 7, and offers the same effects as those of the third preferred embodiment. Though not shown graphically, the drain of the transistor Q11 may be connected to the first input terminal IN1 also in the configuration shown in FIG. 21.

Figure 27:
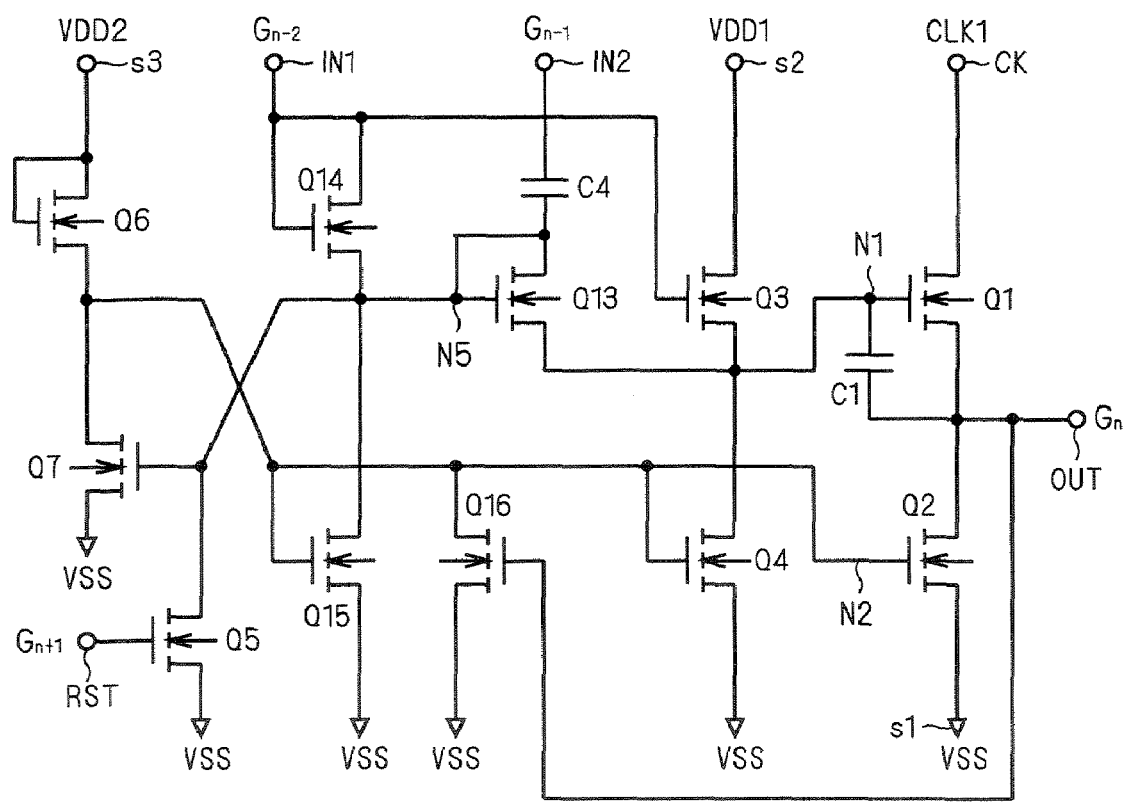
FIG. 27 is a circuit diagram illustrating the configuration of a unit shift register circuit according to the seventeenth preferred embodiment.

Also, for example, with the unit shift register circuit SR of FIG. 11, the drain of the transistor Q14 that charges the node N5 may be connected to the first input terminal IN1 as shown in FIG. 27. Then, the charge used to charge the node N5 is supplied by the output signal $G_{n-2}$ of the two-stages-previous circuit, but this configuration operates the same as circuit shown in FIG. 11, and offers the same effects as those of the sixth preferred embodiment. Though not shown graphically, the drain of the transistor Q14 may be connected to the first input terminal IN1 also in the configurations shown in FIGS. 13 and 15.

While the invention has been described in detail, the foregoing description is in all aspects illustrative and not restrictive. It is understood that numerous other modifications and variations can be devised without departing from the scope of the invention.

What is claimed is:

1. A shift register circuit comprising:
   a clock terminal and an output terminal;
   a first transistor that supplies to said output terminal a first clock signal inputted to said clock terminal;
   a second transistor that discharges said output terminal;
   a third transistor that supplies a potential at a first power-supply terminal to a first node to which a control electrode of said first transistor is connected thereby charging said first node so as to turn on said first transistor;
   a first charging circuit that charges a second node to which a control electrode of said third transistor is connected, on the basis of a signal imputed to a given first input terminal; and
   a first boosting circuit that boosts said second node that has been charged, on the basis of a signal inputted to a given second input terminal.

2. The shift register circuit according to claim 1, wherein said first charging circuit is a fourth transistor connected between said second node and said first power-supply terminal and having its control electrode connected to said first input terminal, and said first boosting circuit is a first capacitive element connected between said second node and said second input terminal.

3. The shift register circuit according to claim 2, wherein said first capacitive element is an MOS (Metal Oxide Semiconductor) capacitive element.

4. The shift register circuit according to claim 1, wherein said first charging circuit is a fourth transistor connected between said second node and said first input terminal and having its control electrode connected to said first input terminal, and said first boosting circuit is a first capacitive element connected between said second node and said second input terminal.

5. The shift register circuit according to claim 4, wherein said first capacitive element is an MOS (Metal Oxide Semiconductor) capacitive element.

6. The shift register circuit according to claim 1, wherein said first charging circuit includes:

a fourth transistor connected between said second node and said first power-supply terminal;

a second charging circuit that charges a third node to which a control electrode of said fourth transistor is connected, on the basis of the signal inputted to said first input terminal; and a second boosting circuit that boosts said third node that has been charged, on the basis of a signal inputted to a given third input terminal, and said first boosting circuit is a first capacitive element connected between said second node and said second input terminal.

7. The shift register circuit according to claim 6, wherein said first capacitive element is an MOS capacitive element.

8. The shift register circuit according to claim 6, wherein said second charging circuit is a fifth transistor connected between said third node and said first power-supply terminal and having its control electrode connected to said first input terminal, and said second boosting circuit is a second capacitive element connected between said third node and said third input terminal.

9. The shift register circuit according to claim 8, wherein said second capacitive element is an MOS capacitive element.

10. The shift register circuit according to claim 6, wherein said second charging circuit is a fifth transistor connected between said third node and said first input terminal and having its control electrode connected to said first input terminal, and said second boosting circuit is a second capacitive element connected between said third node and said third input terminal.

11. The shift register circuit according to claim 10, wherein said second capacitive element is an MOS capacitive element.

12. The shift register circuit according to claim 1, further comprising a third capacitive element connected between said output terminal and said first node.

13. The shift register circuit according to claim 1, wherein a voltage that is larger than an amplitude of said first clock signal is supplied to said first power-supply terminal.

14. A shift register circuit having multiple stages, comprising a plurality of cascade-connected shift register circuits, wherein each of said multiple stages is the shift register circuit according to claim 1.

15. The shift register circuit according to claim 14, further comprising a voltage generating circuit that supplies a voltage that is larger than an amplitude of said first clock signal to said first power-supply terminal of each said shift register circuit.

16. The shift register circuit according to claim 15, wherein said voltage generating circuit includes:

first and second rectifier elements connected in series between said first power-supply terminal of said shift register circuit and a second power-supply terminal supplied with a given potential; and a fourth capacitive element connected between a clock input terminal receiving a given second clock signal and a connection node between said first and second rectifier elements.

17. The shift register circuit according to claim 16, wherein said second clock signal is one phase of multi-phase clock signals supplied to said clock terminals of said stages of shift register circuits.

18. The shift register circuit according to claim 15, wherein said voltage generating circuit is formed within a substrate where said stages of shift register circuits are formed.

19. The shift register circuit according to claim 15, wherein said voltage generating circuit is provided as a circuit external to a substrate where said stages of shift register circuits are formed.

20. The shift register circuit according to claim 16, wherein said first and second rectifier elements of said voltage generating circuit are formed within a substrate where said stages of shift register circuits are formed, and said fourth capacitive element of said voltage generating circuit is provided as an element external to said substrate.

21. The shift register circuit according to claim 16, wherein said fourth capacitive element of said voltage generating circuit is formed within a substrate where said stages of shift register circuits are formed, and said first and second rectifier elements of said voltage generating circuit are formed as elements external to said substrate.

22. The shift register circuit according to claim 15, which comprises a plurality of said voltage generating circuits, wherein said voltage generating circuits are connected in parallel with each other.

23. An image display apparatus having a gate line driving circuit formed of a shift register circuit having multiple stages comprising a plurality of cascade-connected shift register circuits, wherein each of said multiple stages is a shift register circuit comprising:

a clock terminal and an output terminal;

a first transistor that supplies to said output terminal a first clock signal inputted to said clock terminal;

a second transistor that discharges said output terminal;

a third transistor that supplies a potential at a first power-supply terminal to a first node to which a control electrode of said first transistor is connected thereby charging said first node so as to turn on said first transistor;

a first charging circuit that charges a second node to which a control electrode of said third transistor is connected, on the basis of a signal inputted to a given first input terminal; and a first boosting circuit that boosts said second node that has been charged, on the basis of a signal inputted to a given second input terminal.

* * * * *